US010431273B2

United States Patent
Futatsuyama

(10) Patent No.: US 10,431,273 B2
(45) Date of Patent: Oct. 1, 2019

(54) SEMICONDUCTOR MEMORY DEVICE

(71) Applicant: Toshiba Memory Corporation, Minato-ku (JP)

(72) Inventor: Takuya Futatsuyama, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/951,314

(22) Filed: Apr. 12, 2018

(65) Prior Publication Data

US 2018/0233185 A1     Aug. 16, 2018

Related U.S. Application Data

(63) Continuation of application No. PCT/JP2016/050888, filed on Jan. 13, 2016.

(51) Int. Cl.
*G11C 8/08* (2006.01)
*G11C 8/12* (2006.01)
(Continued)

(52) U.S. Cl.
CPC ............. *G11C 8/08* (2013.01); *G11C 5/025* (2013.01); *G11C 8/12* (2013.01); *G11C 8/14* (2013.01); *G11C 11/4085* (2013.01); *G11C 16/0483* (2013.01); *G11C 16/08* (2013.01); *G11C 16/24* (2013.01); *G11C 16/26* (2013.01);
(Continued)

(58) Field of Classification Search
CPC ................. H01L 27/11565; H01L 27/11575
See application file for complete search history.

(56) References Cited

U.S. PATENT DOCUMENTS

2005/0041499 A1    2/2005  Shibayama
2008/0259687 A1*  10/2008  Specht ............... G11C 16/0483
                                                                365/185.17
(Continued)

FOREIGN PATENT DOCUMENTS

JP          2012-54345       3/2012
JP          2015-26674       2/2015
(Continued)

OTHER PUBLICATIONS

International Search Report dated Apr. 12, 2016 in PCT/JP2016/050888, filed on Jan. 13, 2016 (with English Translation).
(Continued)

*Primary Examiner* — Tan T. Nguyen
(74) *Attorney, Agent, or Firm* — Oblon, McClelland, Maier & Neustadt, L.L.P.

(57) ABSTRACT

A semiconductor memory device according to an embodiment includes: a row decoder and a memory cell array including a first block. The first block includes: a first region, a second region adjacent to the first region in the first direction, and a third region configured to connect the first region and the second region. The memory cell array further includes: a first insulating layer buried in a first trench between the first region and the second region and in contact with the third region; a first contact plug provided in the first insulating layer and electrically connected to the row decoder; and a first interconnect configured to connect a selection gate line and the first contact plug.

12 Claims, 28 Drawing Sheets

(51) Int. Cl.
  *G11C 11/408*   (2006.01)
  *G11C 16/04*    (2006.01)
  *G11C 16/08*    (2006.01)
  *G11C 16/24*    (2006.01)
  *G11C 16/26*    (2006.01)
  *G11C 5/02*     (2006.01)
  *G11C 8/14*     (2006.01)
  *H01L 27/11575* (2017.01)
  *H01L 27/11582* (2017.01)
  *G11C 5/06*     (2006.01)
  *G11C 7/12*     (2006.01)
  *H01L 27/11565* (2017.01)

(52) U.S. Cl.
  CPC .. *H01L 27/11575* (2013.01); *H01L 27/11582* (2013.01); *G11C 5/063* (2013.01); *G11C 7/12* (2013.01); *H01L 27/11565* (2013.01)

(56) References Cited

U.S. PATENT DOCUMENTS

| | | | |
|---|---|---|---|
| 2009/0267128 A1 | 10/2009 | Maejima | |
| 2009/0268522 A1 | 10/2009 | Maejima | |
| 2010/0207190 A1* | 8/2010 | Katsumata | G11C 16/0483 257/319 |
| 2010/0207195 A1 | 8/2010 | Fukuzumi et al. | |
| 2010/0214838 A1 | 8/2010 | Hishida et al. | |
| 2011/0121403 A1 | 5/2011 | Lee et al. | |
| 2011/0175159 A1 | 7/2011 | Itagaki et al. | |
| 2011/0284946 A1 | 11/2011 | Kiyotoshi | |
| 2011/0305089 A1 | 12/2011 | Abe et al. | |
| 2012/0049148 A1 | 3/2012 | Fukano | |
| 2012/0063209 A1 | 3/2012 | Koyama et al. | |
| 2012/0064582 A1* | 3/2012 | Tauch | C12N 9/90 435/106 |
| 2012/0069663 A1 | 3/2012 | Itagaki et al. | |
| 2012/0307557 A1 | 12/2012 | Itagaki | |
| 2014/0043902 A1 | 2/2014 | Unno | |
| 2014/0086001 A1 | 3/2014 | Fukano | |
| 2015/0028410 A1 | 1/2015 | Kato | |
| 2017/0263625 A1* | 9/2017 | Kikutani | H01L 27/11582 |

FOREIGN PATENT DOCUMENTS

| | | |
|---|---|---|
| JP | 2015-133504 | 7/2015 |
| JP | 2015-144279 | 8/2015 |
| TW | 201601290 | 1/2016 |

OTHER PUBLICATIONS

Written Opinion dated Apr. 12, 2016 in PCT/JP2016/050888, filed on Jan. 13, 2016.

* cited by examiner

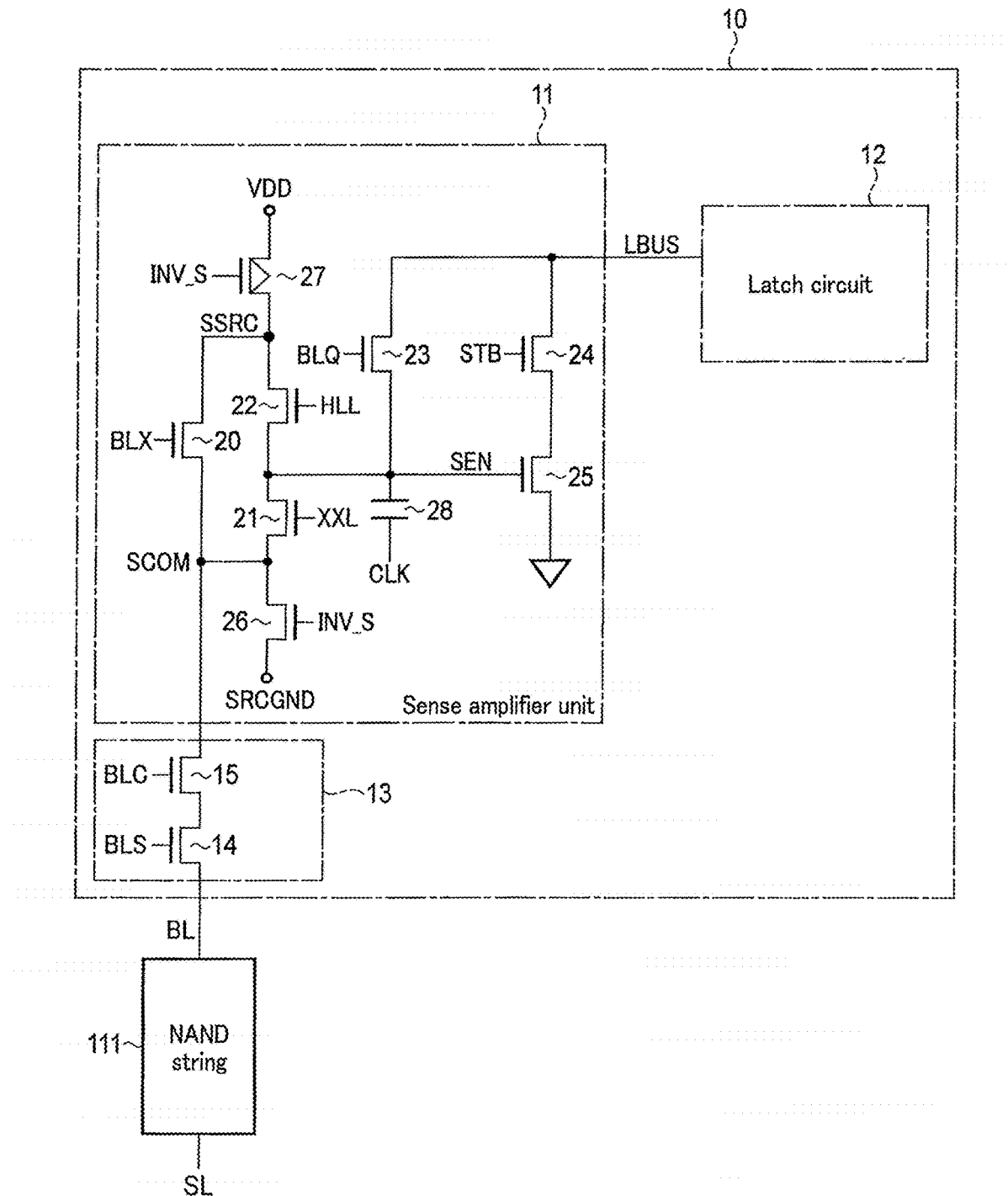
F I G. 4

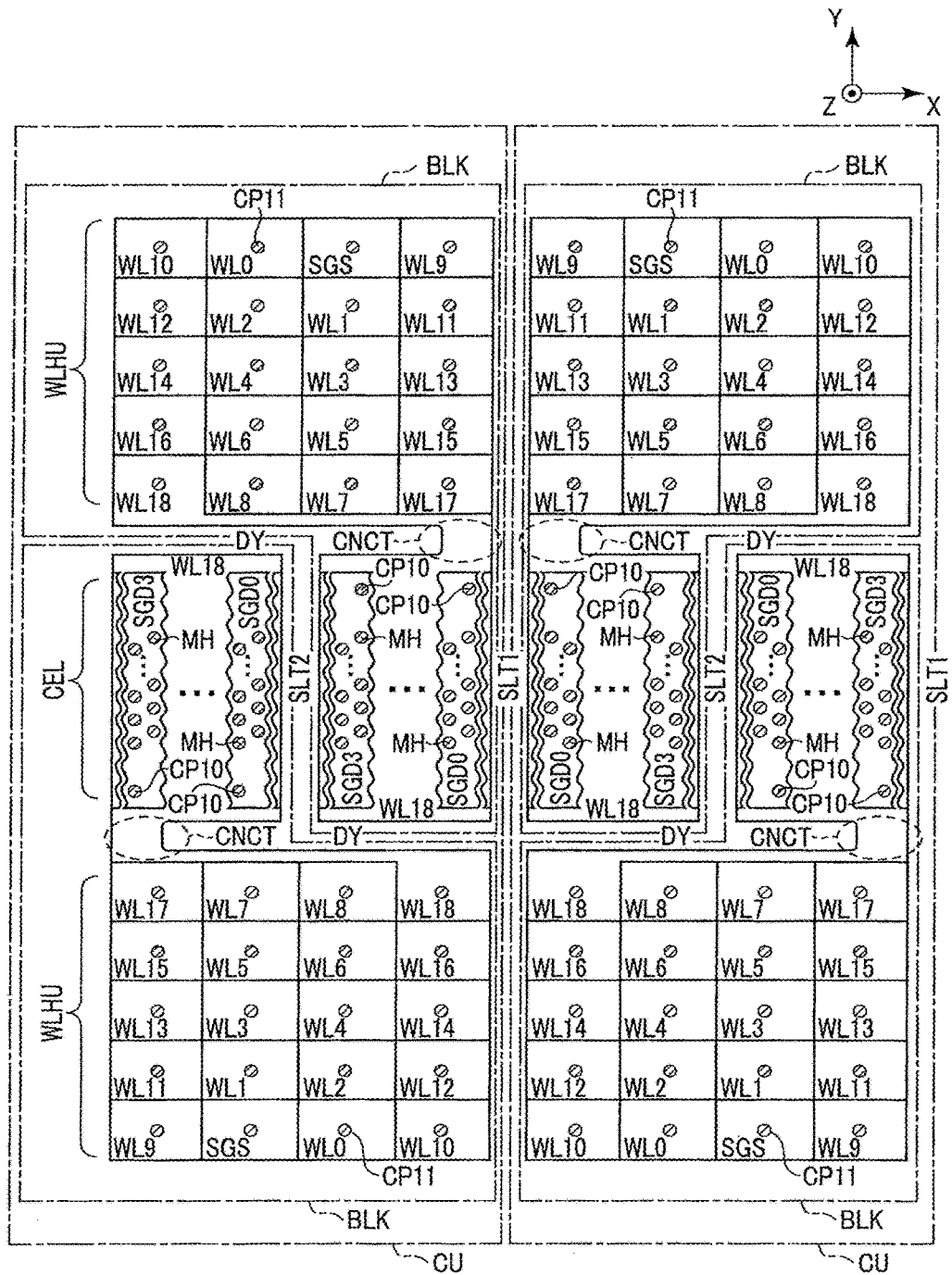
F I G. 10

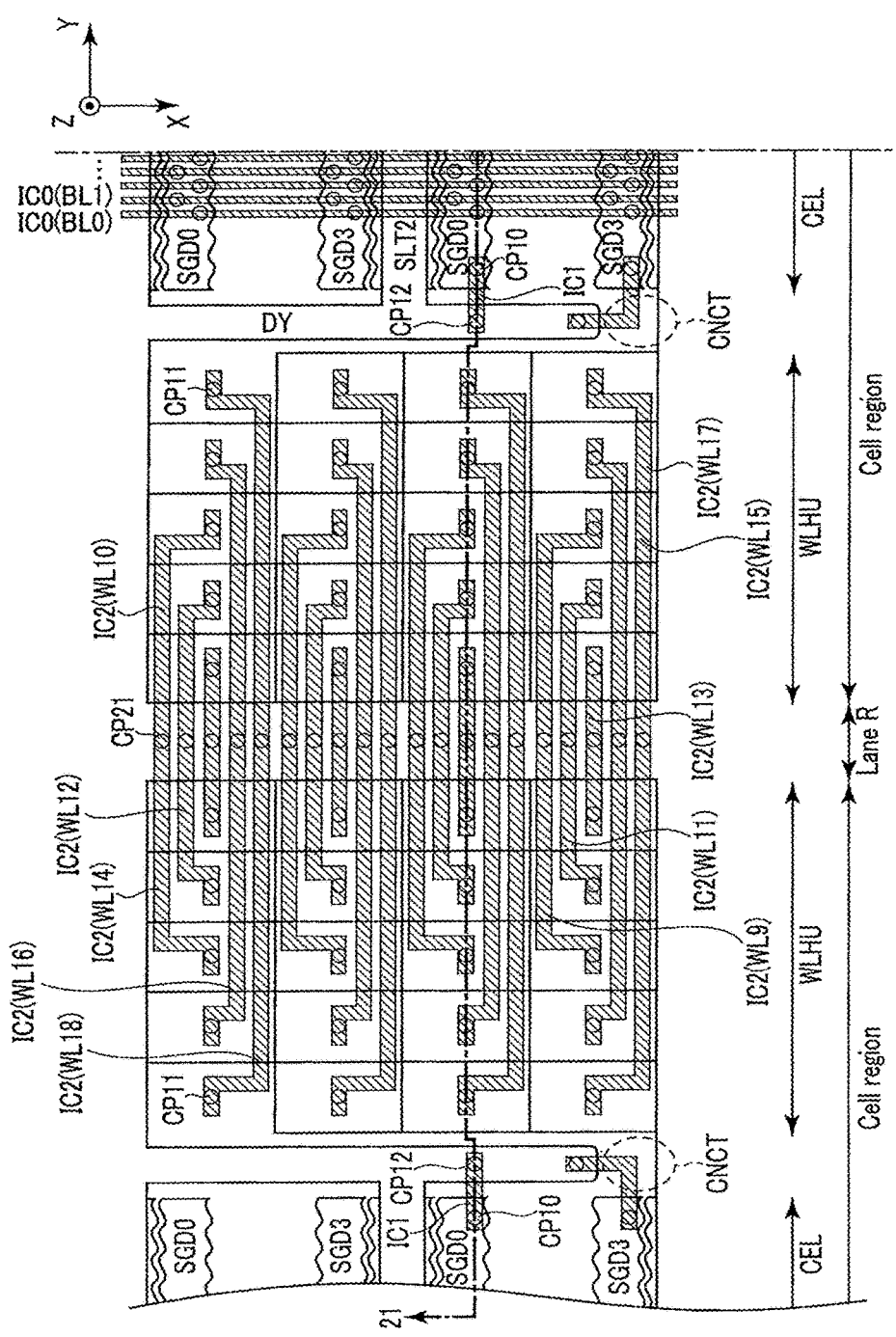
F I G. 13

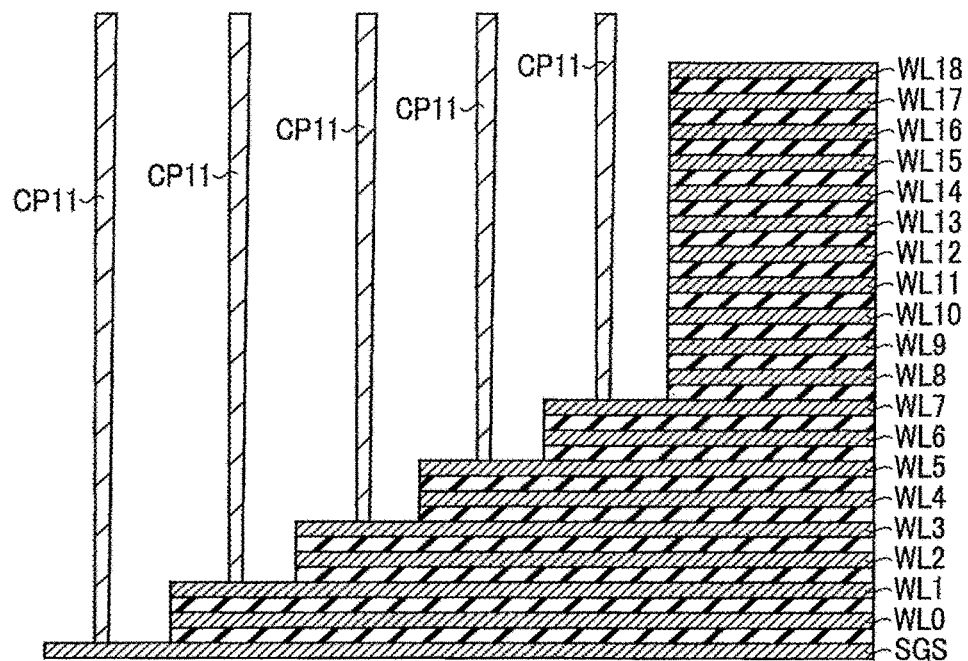
F I G. 16
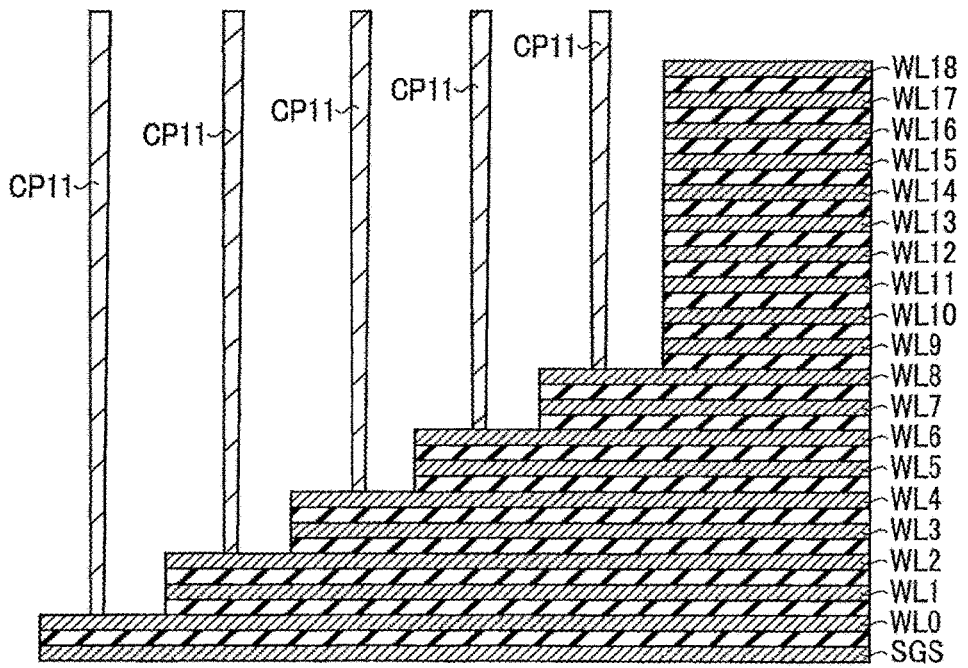
F I G. 17

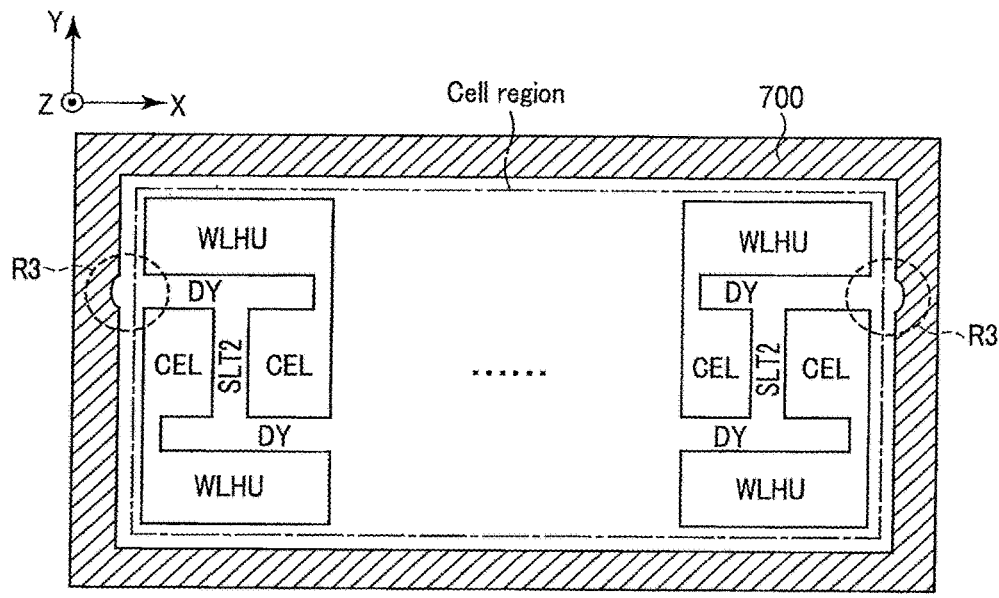
F I G. 29
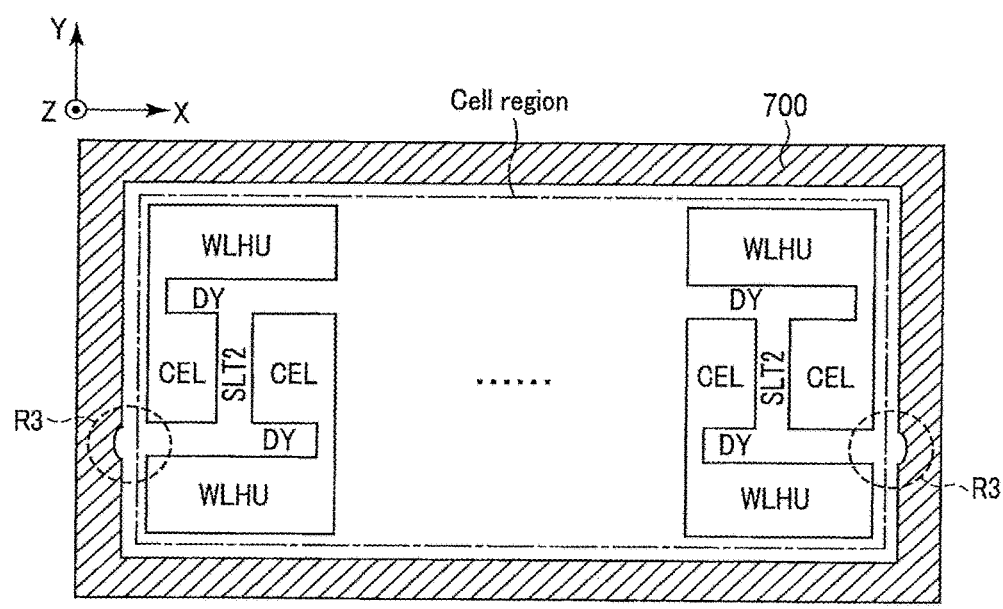
F I G. 30

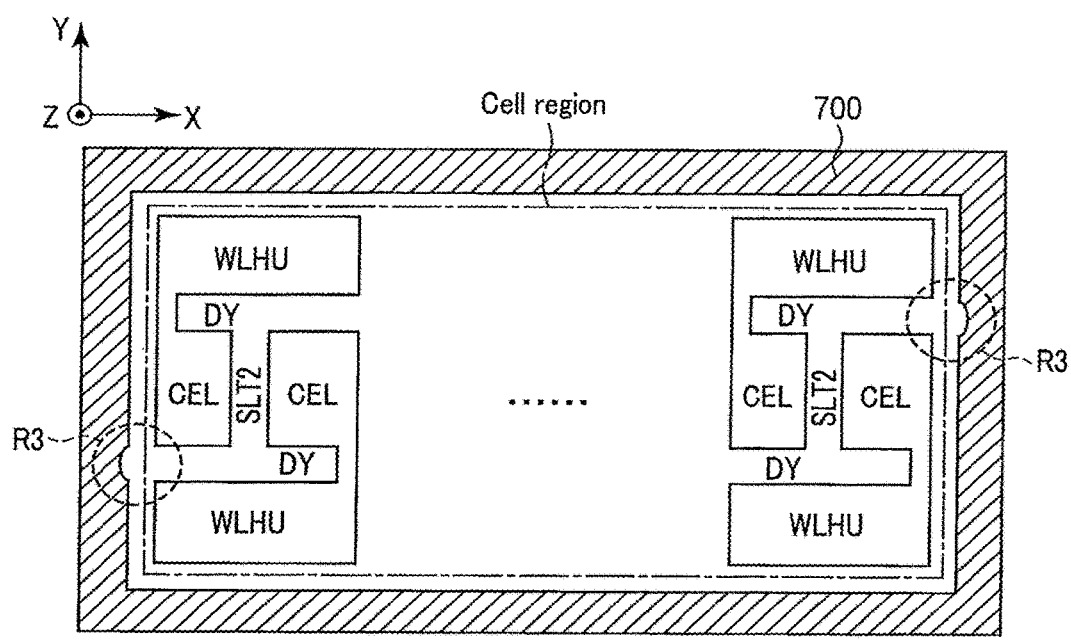
F I G. 31

SEMICONDUCTOR MEMORY DEVICE

CROSS-REFERENCE TO RELATED APPLICATIONS

This application is a Continuation Application of PCT Application No. PCT/JP2016/050888, filed Jan. 13, 2016, the entire contents of which are incorporated herein by reference.

FIELD

Embodiments described herein relate generally to a semiconductor memory device.

BACKGROUND

There is known a semiconductor memory in which memory cells are three-dimensionally arranged.

BRIEF DESCRIPTION OF THE DRAWINGS

FIG. 4 is a circuit diagram of a sense amplifier according to the first embodiment;

FIG. 10 and FIG. 11 are planar layout diagrams of cell units according to the first embodiment;

FIG. 13 is a planar layout diagram of cell regions and a lane R according to the first embodiment;

FIG. 16 is a sectional view of a part of a region taken along a line 16-16 in FIG. 11;

FIG. 17, FIG. 18, FIG. 19, and FIG. 20 are sectional views taken along a line 17-17, a line 18-18, a line 19-19, and a line 20-20 in FIG. 11;

FIG. 29 is a planar layout diagram of a cell region according to the first modification of the third embodiment;

FIG. 30 is a planar layout diagram of a cell region according to the second modification of the third embodiment; and FIG. 31 is a planar layout diagram of a cell region according to the third modification of the third embodiment.

DETAILED DESCRIPTION

Figure 1:
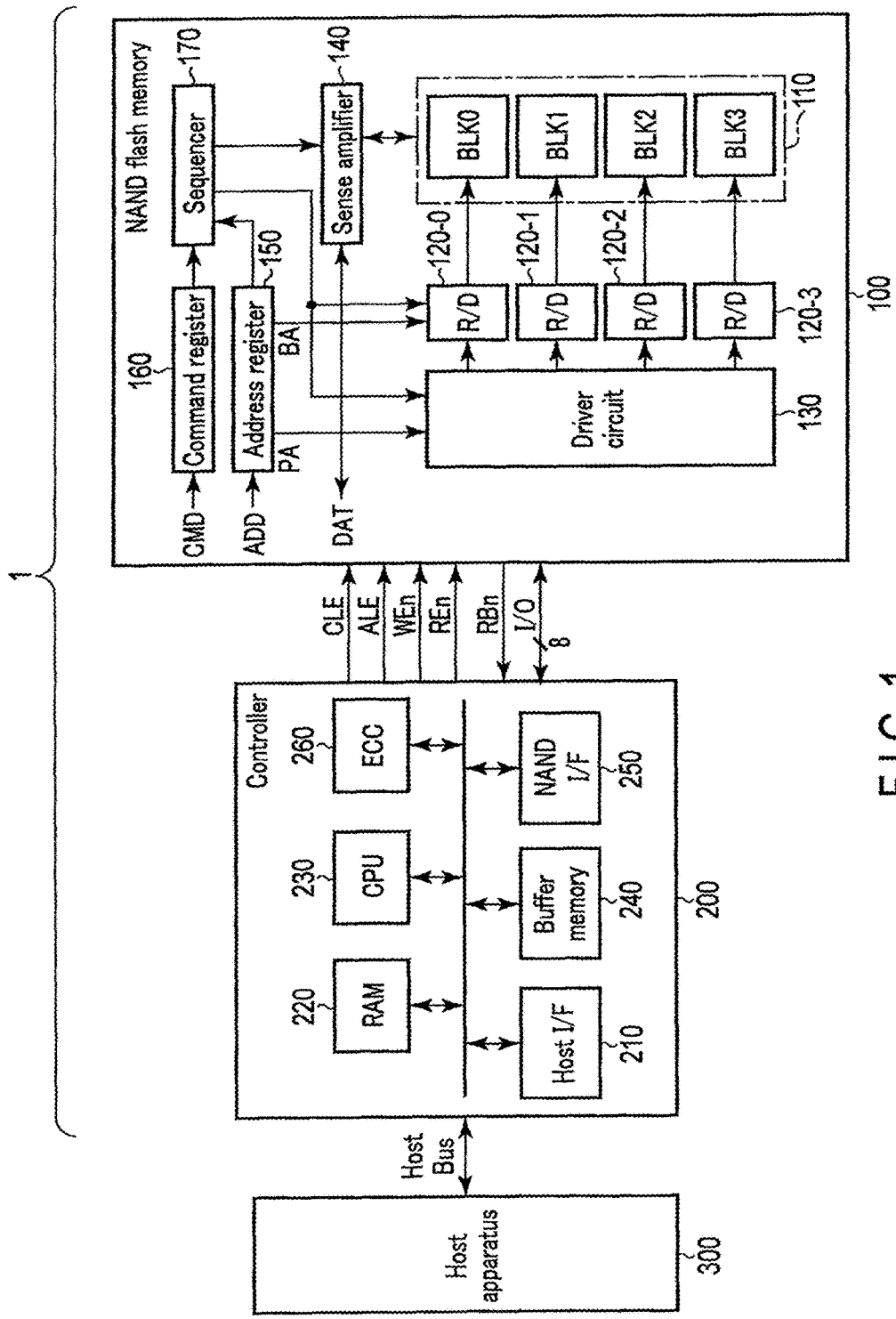
FIG. 1 is a block diagram of a memory system according to the first embodiment.

In general, according to one embodiment, a semiconductor memory device includes: a row decoder provided on a semiconductor substrate; and a memory cell array provided above the row decoder and including a first block. The first block includes: a first region spreading along a first plane formed by a first direction that is an in-plane direction of the semiconductor substrate and a second direction that is the in-plane direction and is different from the first direction and having a first width along the second direction; a second region spreading along the first plane, having a second width larger than the first width along the second direction, and being adjacent to the first region in the first direction; and a third region spreading along the first plane, having a third width smaller than the first width along the second direction, and located between the first region and the second region to connect the first region and the second region. The first region, the second region, and the third region include a plurality of first word lines stacked along a third direction that is a vertical direction of the semiconductor substrate, and the first region further includes a first selection gate line provided above a first word line of an uppermost layer. The memory cell array further includes: a first insulating layer buried in a first trench between the first region and the second region and being in contact with the third region in the second direction; a first contact plug provided in the first insulating layer and electrically connected to the row decoder; and a first interconnect configured to connect the first selection gate line and the first contact plug.

The embodiments will now be described with reference to the accompanying drawings. Note that in the following description, the same reference numerals denote constituent elements having the same functions and arrangements.

1. First Embodiment

A semiconductor memory device according to the first embodiment will be described. A 3D-stacked NAND flash memory in which memory cells are three-dimensionally stacked above a semiconductor substrate will be exemplified below as the semiconductor memory device.

1.1 Arrangement 1.1.1 Overall Arrangement of Memory System

A general overall arrangement of a memory system including the semiconductor memory device according to this embodiment will be described first with reference to FIG. 1. FIG. 1 is a block diagram of the memory system according to this embodiment.

As shown in FIG. 1, a memory system 1 includes a NAND flash memory 100 and a controller 200. The NAND flash memory 100 and the controller 200 may form one semiconductor device by, for example, a combination. Examples of such a device are a memory card such as an SD™ card and an SSD (Solid State Drive).

The NAND flash memory 100 includes a plurality of memory cells and stores data in a nonvolatile manner. The controller 200 is connected to the NAND flash memory 100 by a NAND bus and connected to a host apparatus 300 by a host bus. The controller 200 controls the NAND flash memory 100, and accesses the NAND flash memory 100 in response to an instruction received from the host apparatus 300. The host apparatus 300 is, for example, a digital camera, a personal computer, or the like, and the host bus is, for example, a bus complying with an SD™ interface.

The NAND bus transmits/receives signals complying with a NAND interface. Specific examples of the signals are a command latch enable signal CLE, an address latch enable signal ALE, a write enable signal WEn, a read enable signal REn, a ready busy signal RBn, and an input/output signal I/O.

The signals CLE and ALE are signals that notify the NAND flash memory 100 that the input signals I/O to the NAND flash memory 100 are a command and an address, respectively. The signal WEn is a signal asserted at a low level and used to make the NAND flash memory 100 receive the input signal I/O. Note that "assert" means that a signal (or a logic) is set in a valid (active) state, and "negate" as a term opposed to this means that a signal (or a logic) is set in an invalid (inactive) state. The signal REn is also a signal asserted at a low level and used to read the output signal I/O from the NAND flash memory 100. The ready busy signal REn is a signal representing whether the NAND flash memory 100 is in a ready state (a state in which an instruction from the controller 200 can be received) or a busy state (a state in which an instruction from the controller 200 cannot be received), and the low level represents the busy state. The input/output signal I/O is, for example, an 8-bit signal. The input/output signal I/O is the entity of data transmitted/received between the NAND flash memory 100 and the controller 200 and includes a command, an address, write data, read data, and the like.

1.1.2 Arrangement of Controller 200

Details of the arrangement of the controller 200 will be described next with reference to FIG. 1. As shown in FIG. 1, the controller 200 includes a host interface circuit 210, an embedded memory (RAM) 220, a processor (CPU) 230, a buffer memory 240, a NAND interface circuit 250, and an ECC circuit 260.

The host interface circuit 210 is connected to the host apparatus 300 via the host bus and transfers instructions and data received from the host apparatus 300 to the processor 230 and the buffer memory 240, respectively. The host interface circuit 210 also transfers data in the buffer memory 240 to the host apparatus 300 in response to an instruction from the processor 230.

The processor 230 controls the operation of the entire controller 200. For example, upon receiving a write instruction from the host apparatus 300, the processor 230 issues a write instruction to the NAND interface circuit 250, in response to the instruction. This also applies to read and erase. The processor 230 also executes various processes for managing the NAND flash memory 100 such as wear leveling.

The NAND interface circuit 250 is connected to the NAND flash memory 100 via the NAND bus and controls communication with the NAND flash memory 100. Based on an instruction received from the processor 230, the NAND interface circuit 250 outputs the signals ALE, CLE, WEn, and REn to the NAND flash memory 100. Furthermore, in writing, the NAND interface circuit 250 transfers a write command issued by the processor 230 and write data in the buffer memory 240 to the NAND flash memory 100 as the input/output signal I/O. Moreover, in reading, the NAND interface circuit 250 transfers a read command issued by the processor 230 to the NAND flash memory 100 and further receives data read from the NAND flash memory 100 as the input/output signal I/O, and transfers it to the buffer memory 240.

The buffer memory 240 temporarily holds write data or read data.

The embedded memory 220 is, for example, a semiconductor memory such as a DRAM, and is used as a work area of the processor 230. The embedded memory 220 holds firmware, various kinds of management tables, and the like that are used to manage the NAND flash memory 100.

The ECC circuit 260 executes error correction (ECC: Error Checking and Correcting) processing of data. That is, in data writing, the ECC circuit 260 generates a parity based on write data. In data reading, the ECC circuit 260 generates a syndrome from a parity, detects an error, and corrects the error. Note that the CPU 230 may have the function of the ECC circuit 260.

1.1.3.1 Arrangement of NAND Flash Memory 100

The arrangement of the NAND flash memory 100 will be described next. As shown in FIG. 1, the NAND flash memory 100 includes a memory cell array 110, row decoders 120 (120-0 to 120-3), a driver circuit 130, a sense amplifier 140, an address register 150, a command register 160, and a sequencer 170.

The memory cell array 110 includes, for example, four blocks BLK (BLK0 to BLK3) each including a plurality of nonvolatile memory cells. The memory cell array 110 stores data send from the controller 200.

The row decoders 120-0 to 120-3 are provided in correspondence with the blocks BLK0 to BLK3, respectively, and select the corresponding blocks. Note that the plurality of blocks BLK may be selected by one row decoder. Such an arrangement is described in, for example, U.S. patent application Ser. No. 13/784,512 filed on Mar. 4, 2013 and entitled "NONVOLATILE SEMICONDUCTOR MEMORY DEVICE". This patent application is entirely incorporated herein by reference.

The driver circuit 130 outputs a voltage to a selected one of the blocks BLK0 to BLK3 via a corresponding one of the row decoders 120-0 to 120-3.

In data reading, the sense amplifier 140 senses data read from the memory cell array 110 and outputs data DAT to the controller. In data writing, the sense amplifier 140 transfers the write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held by the command register 160. In addition, when setting a ROM fuse, the address of ROM fuse data is held by the address register 150, a ROM fuse register in the sequencer 170 is accessed based on the information, and the value of the register is updated. This also applies to a set feature command in the NAND interface. The set feature command is a command issued by the controller 200 and used to set various parameters of the NAND flash memory 100. When the set feature command is set in the command register, parameter data transmitted from the controller 200 next to the set feature command are set in various kinds of registers in the sequencer 170.

1.1.3.2 Circuit Arrangement of Memory Cell Array 110

Figure 2:
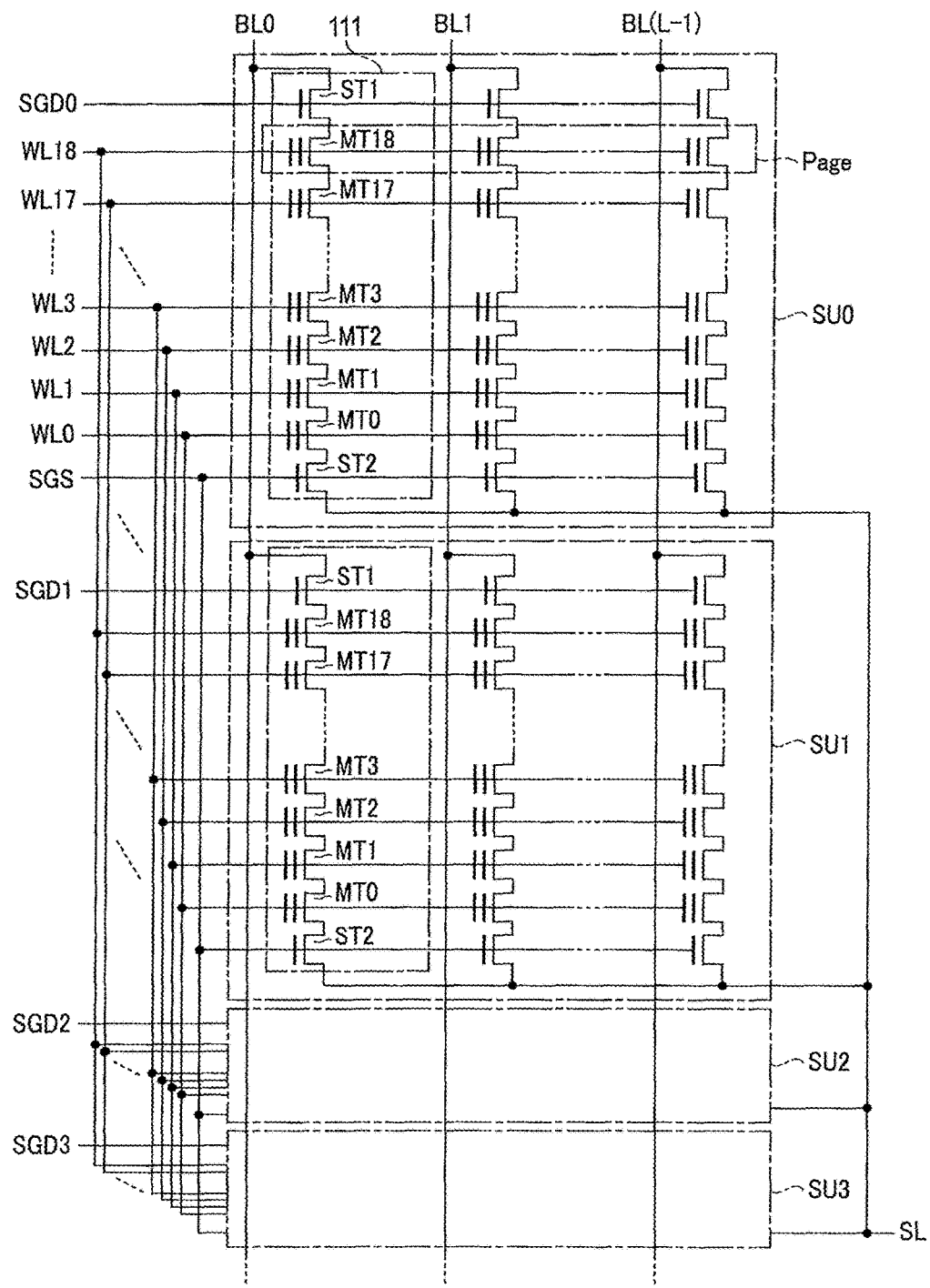
FIG. 2 is a circuit diagram of a block provided in the semiconductor memory device according to the first embodiment.

The circuit arrangement of the memory cell array 110 will be described next. FIG. 2 is a circuit diagram of one of the blocks BLK, and the remaining blocks BLK also have the same arrangement.

As shown in FIG. 2, the block BLK includes, for example, four string units SU (SU0 to SU3). Each string unit SU includes a plurality of NAND strings 111.

Each of the NAND strings 111 includes, for example, 19 memory cell transistors MT (MT0 to MT18), and selection transistors ST (ST1 and ST2).

The memory cell transistor MT includes a stacked gate including a control gate and a charge accumulation layer, and holds data in a nonvolatile manner. The number of memory cell transistors MT is not limited to 19, and the number is not limited. In addition, the charge accumulation layer may be formed by a conductive layer (FG structure) or may be formed by an insulating layer (MONOS structure). The current paths of the plurality of memory cell transistors MT are connected in series between the selection transistors ST1 and ST2. The current path of the memory cell transistor MT18 on one end side of the series connection is connected to one end of the current path of the selection transistor ST1, and the current path of the memory cell transistor MT0 on the other end side is connected to one end of the current path of the selection transistor ST2.

The gates of the selection transistors ST1 in the string units SU0 to SU3 are commonly connected to selection gate lines SGD0 to SGD3, respectively. On the other hand, the gates of the selection transistors ST2 are commonly connected to the same selection gate line SGS between the plurality of string units. In addition, the control gates of the memory cell transistors MT0 to MT18 in the same block are commonly connected to word lines WL0 to WL18, respectively.

That is, the word lines WL0 to WL18 and the selection gate line SGS are commonly connected between the plurality of string units SU0 to SU3 in the same block BLK, whereas the selection gate line SGD is independently provided for each of the string units SU0 to SU3 even in the same block BLK.

In addition, of the NAND strings 111 arranged in a matrix in the memory cell array 110, the other end sides of the current paths of the selection transistors ST1 of the NAND strings 111 on the same column are commonly connected to bit lines BL (BL0 to BL(L−1), (L−1) is a natural number not less than 1). That is, the bit lines BL commonly connect the NAND strings 111 between the plurality of string units SU, and also commonly connect the NAND strings 111 between the plurality of blocks BLK. Furthermore, the other end sides of the current paths of the selection transistors ST2 are commonly connected to a source line SL. The source line SL commonly connects the NAND strings 111 between, for example, the plurality of blocks.

Data of the memory cell transistors MT in the same block may be erased at once. On the other hand, reading and writing of data is performed at once for the plurality of memory cell transistors MT commonly connected to one word line WL in one of the string units SU in one of the blocks.

In addition, data erase may be performed for each block BLK or a unit smaller than the block BLK. An erase method is described in, for example, U.S. patent application Ser. No. 13/235,389 filed on Sep. 18, 2011 and entitled "NON-VOLATILE SEMICONDUCTOR MEMORY DEVICE". Further, an erase method is described in U.S. patent application Ser. No. 12/694,690 filed on Jan. 27, 2010 and entitled "NON-VOLATILE SEMICONDUCTOR STORAGE DEVICE". Still an erase method is described in U.S. patent application Ser. No. 13/483,610 filed on May 30, 2012 and entitled "NONVOLATILE SEMICONDUCTOR MEMORY DEVICE AND DATA ERASE METHOD THEREOF". These patent applications are entirely incorporated herein by reference.

1.1.3.3 Circuit Arrangement of Row Decoders 120

Figure 3:
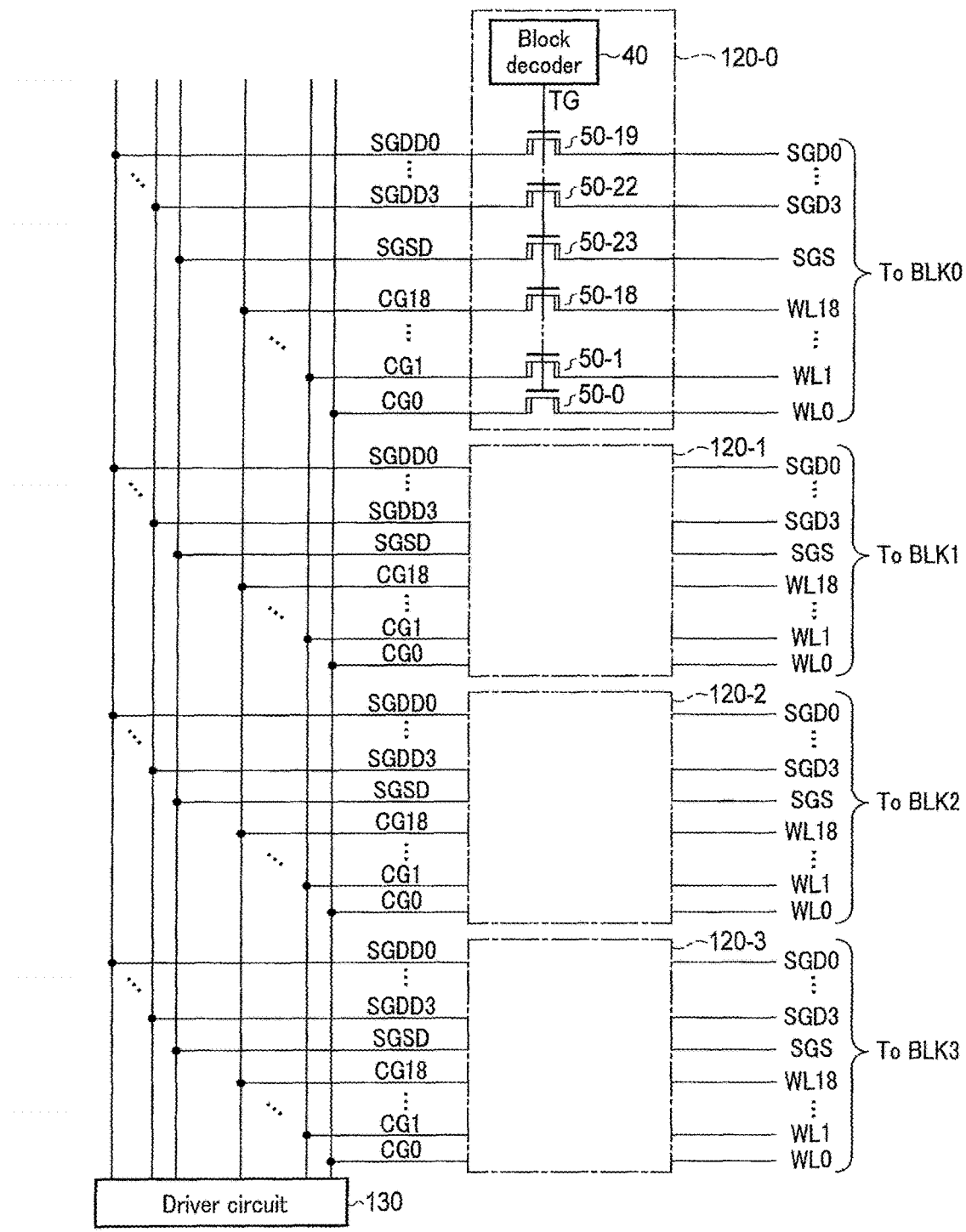
FIG. 3 is a circuit diagram of row decoders according to the first embodiment.

The circuit arrangement of the row decoders 120 will be described next with reference to FIG. 3. As shown in FIG. 3, each row decoder 120 includes a block decoder 40, and high-withstand-voltage n-channel MOS transistors 50 (50-0 to 50-23).

The block decoder 40 will be described first. In data writing, reading, and erasing, the block decoder 40 decodes a block address BA received from the address register 150. If the block address BA matches the corresponding block BLK, a signal TG is asserted. The potential of the asserted signal TG is set to a voltage that sets the transistors 50 in an ON state. On the other hand, if the block address BA does not match the block BLK, the signal TG is negated, and the potential of the signal TG is set to a voltage (for example, 0 V) that sets the transistors 50 in an OFF state.

The transistors 50 will be described next. The transistors 50-0 to 50-18 are configured to transfer voltages to the word lines WL0 to WL18 of the selected block BLK. One end sides of the current paths of the transistors 50-0 to 50-18 are connected to the word lines WL0 to WL18 of the corresponding block BLK, respectively, the other end sides are connected to signal lines CG0 to CG18, respectively, and the gates are commonly connected to the signal line TG.

The transistors 50-19 to 50-22 are configured to transfer voltages to the selection gate lines SGD0 to SGD3 of the selected block BLK. One end sides of the current paths of the transistors 50-19 to 50-22 are connected to the selection gate lines SGD0 to SGD3 of the corresponding block BLK, respectively, the other end sides are connected to signal lines SGDD0 to SGDD3, respectively, and the gates are commonly connected to the signal line TG.

The transistor 50-23 is configured to transfer a voltage to the selection gate line SGS of the selected block BLK. One end of the current path of the transistor 50-23 is connected to the selection gate line SGS of the corresponding block BLK, the other end is connected to a signal line SGSD, and the gate is commonly connected to the signal line TG.

Hence, for example, in the row decoder 120 corresponding to the selected block ELK, the transistors 50-0 to 50-23 are turned on. Accordingly, the word lines WL0 to WL18 are connected to the signal lines CG0 to CG18, the selection gate lines SGD0 to SGD3 are connected to the signal lines SGDD0 to SGDD3, and the selection gate line. SGS is connected to the signal line SGSD.

On the other hand, in the row decoder 120 corresponding to the non-selected block ELK, the transistors 50-0 to 50-23 are set in the OFF state. Accordingly, the word lines WL and the selection gate lines SGD and SGS are disconnected from the signal lines CG, SGDD, and SGSD.

The signal lines CG, SGDD, and SGSD are commonly used by the row decoders 120-1 to 120-3. Then, the driver circuit 130 applies voltages to the signal lines CG, SGDD, and SGSD in accordance with a page address PA received from the address register 150. That is, voltages output from the driver circuit 130 are transferred to the interconnects WL, SGD, and SGS in the selected block via the transistors 50 in one of the row decoders 120 corresponding to the selected block.

1.1.3.4 Circuit Arrangement of Sense Amplifier 140

The circuit arrangement of the sense amplifier 140 will be described next. As the sense amplifier 140 according to this example, an arrangement for determining data by sensing a current flowing to a bit line will be exemplified. However, an arrangement for sensing a voltage is also possible.

The sense amplifier 140 includes a sense circuit 10 provided for each bit line BL. FIG. 4 is a circuit diagram of the sense circuit 10.

As shown FIG. 4, the sense circuit 10 generally includes a sense amplifier unit 11, a latch circuit 12, and a connecting portion 13. Note that when each memory cell transistor holds data of two or more bits, two or more latch circuits are provided.

The connecting portion 13 connects the corresponding bit line BL and the sense amplifier unit 11 and controls the potential of the bit line BL. The connecting portion 13 includes n-channel MOS transistors 14 and 15. In the transistor 14, a signal BLS is applied to the gate, and the source is connected to the corresponding bit line BL. In the transistor 15, the source is connected to the drain of the transistor 14, a signal BLC is applied to the gate, and the drain is connected to a node SCOM. The transistor 15 is configured to clamp the corresponding bit line BL to a potential according to the signal BLC.

The sense amplifier unit 11 senses data read to the bit line BL. The sense amplifier unit 11 includes n-channel MOS transistors 20 to 26, a p-channel MOS transistor 27, and a capacitive element 28.

The transistor 27 is configured to charge the bit line BL and the capacitive element 28, and a node_is connected to the gate, the drain is connected to a node SSRC, and a power supply voltage VDD is applied to the source. The transistor 20 is configured to precharge the bit line BL, and a signal BLX is applied to the gate, the drain is connected to the node SSRC, and the source is connected to the node SCOM. The transistor 22 is configured to charge the capacitive element 28, and a signal HLL is applied to the gate, the drain is connected to the node SSRC, and the source is connected to a node SEN. The transistor 21 is configured to discharge the node SEN in data sensing, and a signal XXL is applied to the gate, the drain is connected to the node SEN, and the source is connected to the node SCOM. The transistor 26 is configured to fix the bit line BL to a predetermined potential, and the gate is connected to the node INV_S, the drain is connected to the node SCOM, and the source is connected to a node SRCGND.

The capacitive element 28 is charged in precharging the bit line BL. One electrode is connected to the node SEN, and a signal CLK is applied to the other electrode.

In the transistor 23; a signal BLQ is applied to the gate, the source is connected to the node SEN, and the drain is connected to a node LBUS. The node LBUS is a signal path used to connect the sense amplifier unit 11 and the latch circuit 12. The transistor 24 is configured to decide a data sense timing and also store read data in the latch circuit 12, and a signal STB is applied to the gate, and the drain is connected to the node LBUS.

The transistor 25 is configured to sense whether read data is "0" or "1", and the gate is connected to the node SEN, the drain is connected to the source of the transistor 24, and the source is grounded.

The node INV_S is a node in the latch circuit 12 and may have a level according to data held by the latch circuit 12. For example, in data reading, if a selected memory cell turns on and the potential of the node SEN sufficiently lowers, the node INV_S is set at "H" level. On the other hand, if the selected memory cell is in the OFF state and the node SEN holds a predetermined potential, the node INV_S is set at "L" level.

In the above-described arrangement, at the timing when the signal STB is asserted, the transistor 25 senses read data based on the potential of the node SEN, and the transistor 24 transfers the read data to the latch circuit 12. The various kinds of control signals including the signal STB are issued from, for example, the sequencer 170.

Note that various arrangements are applicable as the sense circuit 10. For example, an arrangement described in U.S. patent application Ser. No. 13/052,148 filed on Mar. 21, 2011 and entitled "THRESHOLD DETECTING METHOD AND VERIFY METHOD OF MEMORY CELL" is applicable. This patent application is entirely incorporated herein by reference.

1.2 Planar Layout and Sectional Structure of NAND Flash Memory 100

A detailed example of the planar layout and the sectional structure of the NAND flash memory 100 having the above-described arrangement will be described next while placing focus on the memory cell array 110, the row decoder 120, and the sense amplifier 140.

1.2.1 Overall Arrangement

Figure 5:
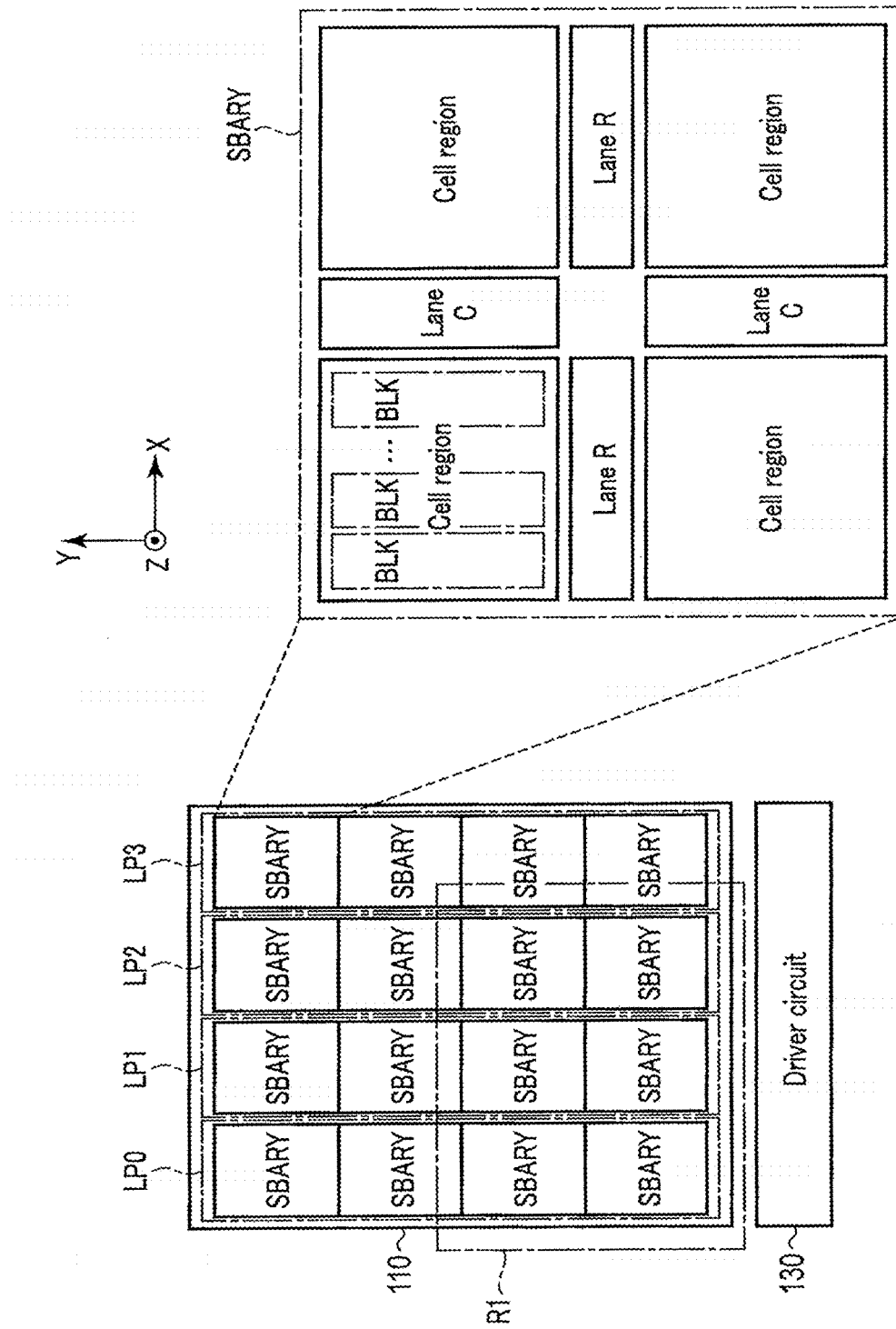
FIG. 5 is a planar layout diagram of a memory cell array and a driver circuit according to the first embodiment.

A rough planar layout and sectional structure will be described first with reference to FIG. 5. FIG. 5 shows the planar layout of the memory cell array 110 and the driver circuit 130. As shown in FIG. 5, the memory cell array 110 includes, for example, four logical planes LP (LP0 to LP3) arranged in the X-axis direction. The logical plane LP is a logical access unit to the memory cell array 110. It is also possible to simultaneously access a plurality of logical planes LP.

Note that the Z-axis direction orthogonal to the X-axis direction is a direction vertical to the surface of the semiconductor substrate on which the NAND flash memory 100 is formed. In addition, the X-axis direction is orthogonal to the Z-axis direction, and is one of the in-plane directions of the semiconductor substrate. The Y-axis direction is orthogonal to the Z- and X-axis directions, and is one of the in-plane direction of the semiconductor substrate different from the X-axis direction.

Each logical plane LP includes, for example, four sub-arrays SBARY arranged along the Y-axis direction. Hence, in the example shown in FIG. 5, the memory cell array 110 includes (4×4) sub-arrays SBARY on the X-Y plane.

Each of the sub-arrays SBARY includes, for example, four cell regions, two lanes C, and two lanes R. The four cell regions are arranged in a (2×2) matrix on the X-Y plane. The lane C is provided between two cell regions adjacent along the X-axis direction. The lane R is provided between two cell regions adjacent along the Y-axis direction. The cell region is a region where the memory cell transistors MT are actually formed. In the cell region, the memory cell transistors MT are stacked along the Z-axis direction, thereby forming the NAND strings 111, and the sets of the NAND strings 111 form the plurality of blocks BLK. On the other hand, the lanes C are connecting portions associated with interconnects related to the column such as bit lines BL and the lanes R are connecting portions associated with interconnects related to the row such as word lines and signal lines CG.

Note that the lanes C and the lanes R are provided not only in each sub-array but also between adjacent sub-arrays. FIG.

Figure 6:
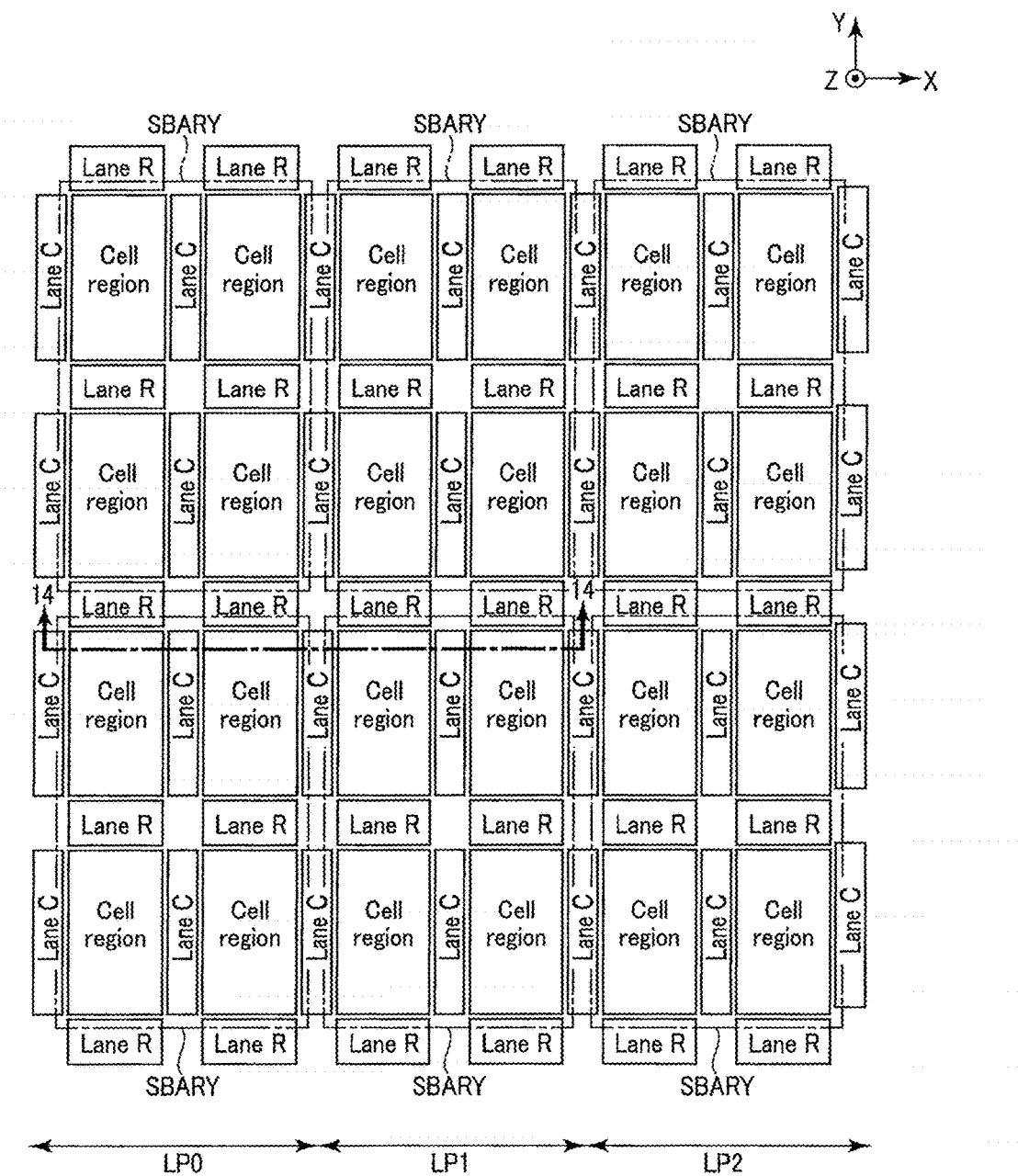
FIG. 6 is a planar layout diagram of the memory cell array according to the first embodiment.

6 shows this state. FIG. 6 shows a region R1 in FIG. 5 in detail. As shown in FIG. 6, the lanes R are also provided between cell regions that belong to the sub-arrays SBARY different from each other and are adjacent in the Y-axis direction. In addition, the lanes C are also provided between cell regions that belong to the sub-arrays SBARY (in other words, the logical planes LP) different from each other and are adjacent in the X-axis direction.

Figure 7:
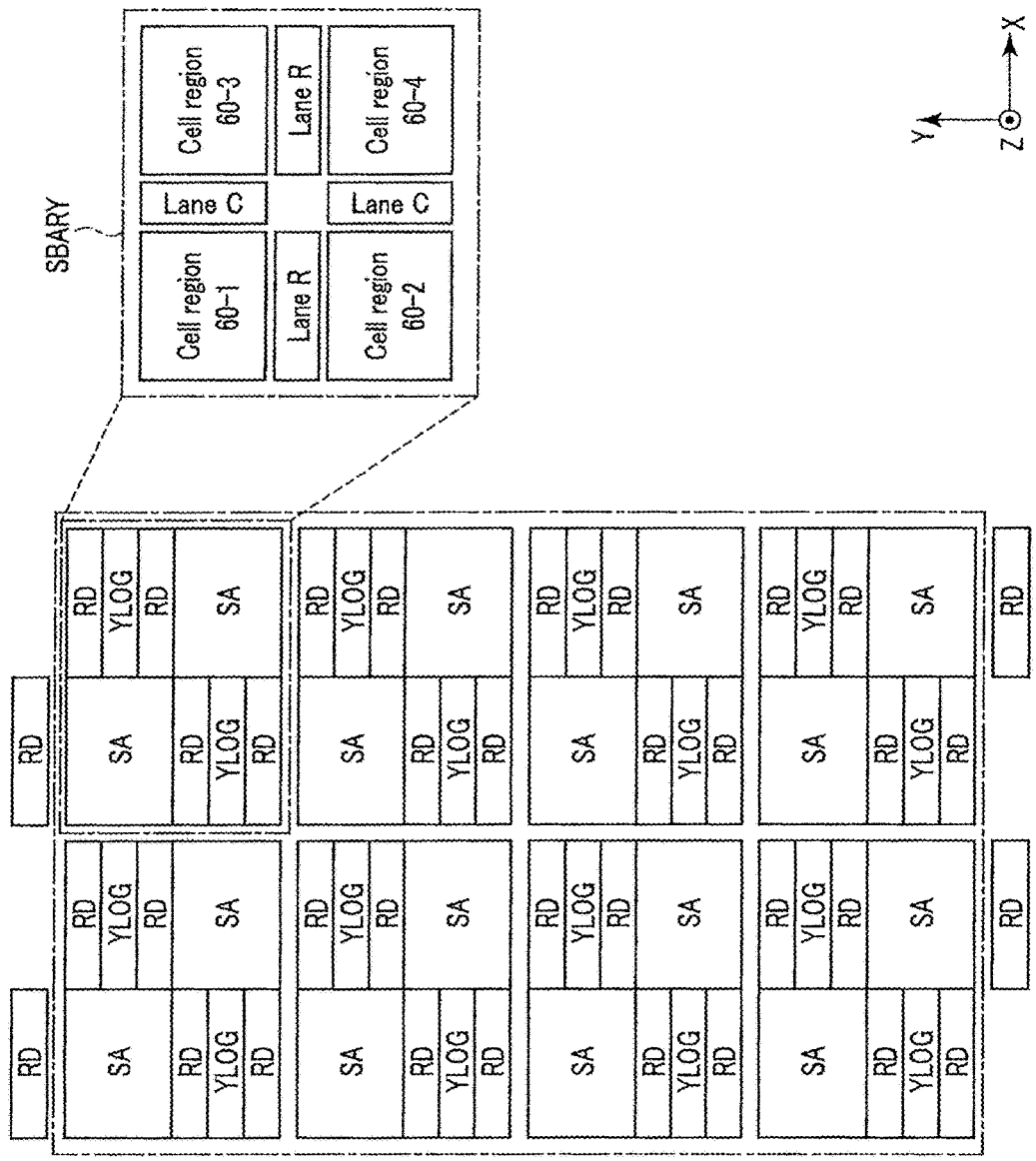
FIG. 7 is a planar layout diagram of a region under the memory cell array according to the first embodiment.

FIG. 7 shows the planar layout (the layout viewed on the X-Y plane) of the row decoder 120 and the sense amplifier 140. The row decoder 120 and the sense amplifier 140 are located immediately under the memory cell array 110. FIG. 7 shows an example of the arrangement of the row decoder 120 and the sense amplifier 140 in a region overlapping two logical planes LP (that is, (4×2) sub-arrays SBARY) in the Z-axis direction. Note that each of the row decoder 120 and the sense amplifier 140 is divided into a plurality of regions and formed on the semiconductor substrate. The divided regions will be referred to as row decoders RD and sense amplifiers SA hereinafter. In addition, the sense circuit 10 includes a plurality of latch circuits, and includes an arithmetic circuit that performs an operation using data held by the latch circuits, although a description thereof has been omitted in FIG. 4. The arithmetic circuit is shown as an arithmetic circuit YLOG in FIG. 7.

As shown in FIG. 7, two sense amplifier circuits SA, four row decoders RD, and two arithmetic circuits YLOG are arranged immediately under one sub-array SBARY. Placing focus on a certain sub-array SBARY, in the example shown in FIG. 7, the sense amplifier SA is arranged immediately under a cell region 60-1 located at the upper left position of the sheet surface of FIG. 7. In addition, the row decoder RD, the arithmetic circuit YLOG, and the row decoder RD are sequentially arranged along the Y-axis direction immediately under a cell region 60-2 adjacent to the cell region 60-1 across the lane R in the Y-axis direction. Furthermore, the row decoder RD, the arithmetic circuit YLOG, and the row decoder RD are sequentially arranged along the Y-axis direction immediately under a cell region 60-3 adjacent to the cell region 60-1 across the lane C in the X-axis direction. Then, the sense amplifier SA is arranged immediately under a cell region 60-4 adjacent to the cell region 60-3 in the Y-axis direction.

That is, the sense amplifiers SA, the row decoders RD, and the arithmetic circuits YLOG are periodically arranged in the region immediately under the memory cell array 110. That is, each sense amplifier SA is adjacent to the set of two row decoders RD and the arithmetic circuit YLOG in both the Y-axis direction and the X-axis direction. Each set of the row decoders RD and the arithmetic circuit YLOG is also adjacent to the sense amplifier SA in both the Y-axis direction and the X-axis direction. That is, in the region immediately under the memory cell array 110, the sense amplifiers SA and the sets of the row decoders RD and the arithmetic circuits YLOG are alternately arranged in both the X-axis direction and the Y-axis direction. One sense amplifier SA overlaps one cell region 60, and one set of the row decoders RD and the arithmetic circuit YLOG overlaps one cell region 60.

Figure 8:
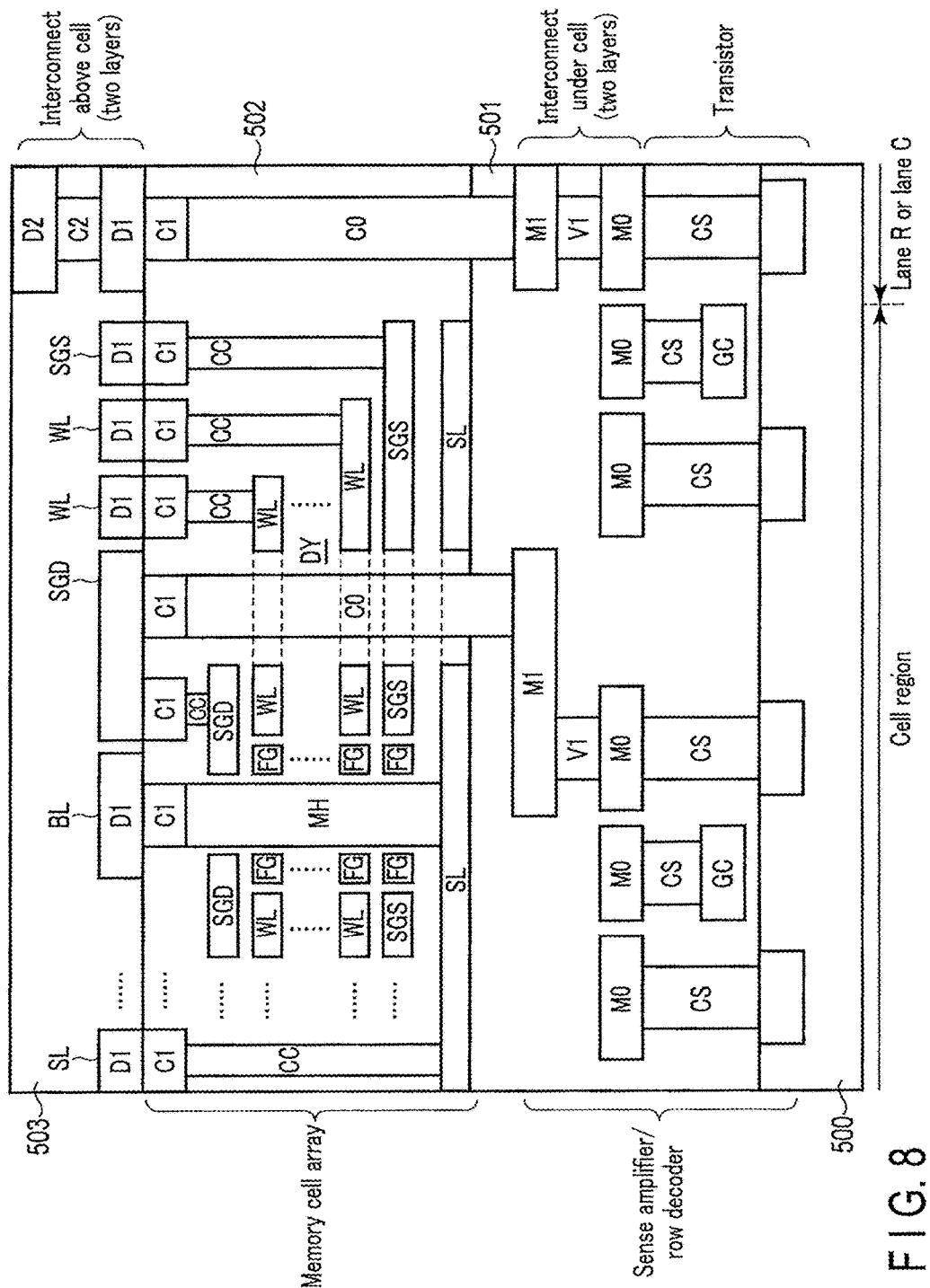
FIG. 8 is a sectional view schematically showing the memory cell array and the region under the memory cell array according to the first embodiment.

FIG. 8 is a sectional view of the memory cell array and the region immediately under the memory cell array, and shows the typical arrangement of the sub-array SBARY.

As shown in FIG. 8, the sense amplifier 140 and the row decoder 120 are formed on a semiconductor substrate 500. An interlayer dielectric film 501 is formed on the semiconductor substrate 500 so as to cover these elements, and the memory cell array 110 is formed on the interlayer dielectric film 501. An interlayer dielectric film 502 is formed on the interlayer dielectric film 501 so as to cover the memory cell array 110.

That is, semiconductor elements (MOS transistors and the like) included in the sense amplifier 140 and the row decoder 120 are formed on the semiconductor substrate 500. For example, two metal interconnect layers (interconnects M0 and M1 under the cells) are formed in the interlayer dielectric film 501 that covers the semiconductor elements. The interconnect M1 is formed above the interconnects M0. The interconnects M0 and M1 electrically connect the semiconductor elements in the sense amplifier 140 and the row decoder 120, and also electrically connect the sense amplifier 140 and the row decoder 120 to the memory cell array 110. The interconnect M0 and the semiconductor substrate 500 or the gate CG are connected by a contact plug CS. In addition, the interconnects M0 and M1 are connected by a contact plug V1.

The memory cell array 110 is formed on the interlayer dielectric film 501. In the cell region, a conductive layer (for example, a polysilicon layer or a metal layer) functioning as the source line SL is formed on the interlayer dielectric film 501, and a silicon pillar MH that becomes the current path of the NAND string 111 (a region where the channels of the memory cell transistor MT and selection transistors ST1 and ST2 are formed) is formed on the source line SL. A plurality of conductive layers (for example, polysilicon layers) functioning as the selection gate line SGS, the word lines WL, and the selection gate line SGD are further formed on an insulating film on the source line SL. In addition, a charge accumulation layer is formed between the silicon pillar MH and each of the selection gate line SGS and the word lines WL so as to surround the silicon pillar MH. The charge accumulation layer is a floating gate electrode FG formed by, for example, a conductive layer (polysilicon layer or the like). However, the charge accumulation layer may be formed by an insulating film. A gate insulating film is provided between the silicon pillar MH and the floating gate electrodes FG. In addition, a block insulating film is provided between the floating gate electrode FG and a selection gate SGS and the word lines WL.

Additionally, a trench DY extending from the word line of the uppermost layer to the source line SL is provided in the cell region. The trench DY is filled with the interlayer dielectric film 502. In the region shown in FIG. 8, each of the conductive layers functioning as the word lines WL, the selection gate line SGS, and the source line SL is divided by the trench DY into two regions. However, the regions are connected in a region not shown (a connecting portion CNCT to be described later). Additionally, a contact plug C0 connected to the interconnect M1 is provided in the trench DY.

An end of each of the selection gate line SGS and the word lines WL facing the lane R has a step shape. That is, the ends of the selection gate line SGS and the word lines WL are processed so as not to overlap the interconnects (word lines WL) on the above layer. In this region, contact plugs CC are formed on the selection gate lines SGS and SGD and the word lines WL.

In the lane R or C, the contact plug C0 connected to the interconnect M1 is formed in the interlayer dielectric film 502.

Contact plugs C1 are formed on the silicon pillar MH and the contact plugs CC. In addition, the interlayer dielectric film 502 is formed to cover the above-described components.

An interlayer dielectric film 503 is formed on the interlayer dielectric film 502. Two metal interconnect layers (interconnects D1 and D2 on the cells) are formed in the interlayer dielectric film 503. The interconnect D2 is formed above the interconnects D1. For example, the interconnects D1 electrically connect the memory cell array 110 to the row decoder 120 and the sense amplifier 140, and a signal that controls the row decoder 120 or the sense amplifier 140 is transmitted by the interconnect D2.

In the cell region, the interconnects D1 connected to the contact plugs C1 are formed on the interlayer dielectric film 502, and these function as the selection gate lines SGD and SGS, the word lines WL, the bit line BL, and the source line SL. In addition, the interconnect D2 is connected to the interconnect D1 by a contact plug C2 (not shown).

1.2.2 Details of Sub-Array SBARY

Details of the arrangement of the sub-array SBARY will be described next.

1.2.2.1 Planar Structure of Sub-Array SBARY

First, details of the planar structure of the sub-array SBARY will be described.

<Planar Structure of Cell Region>

Figure 9:
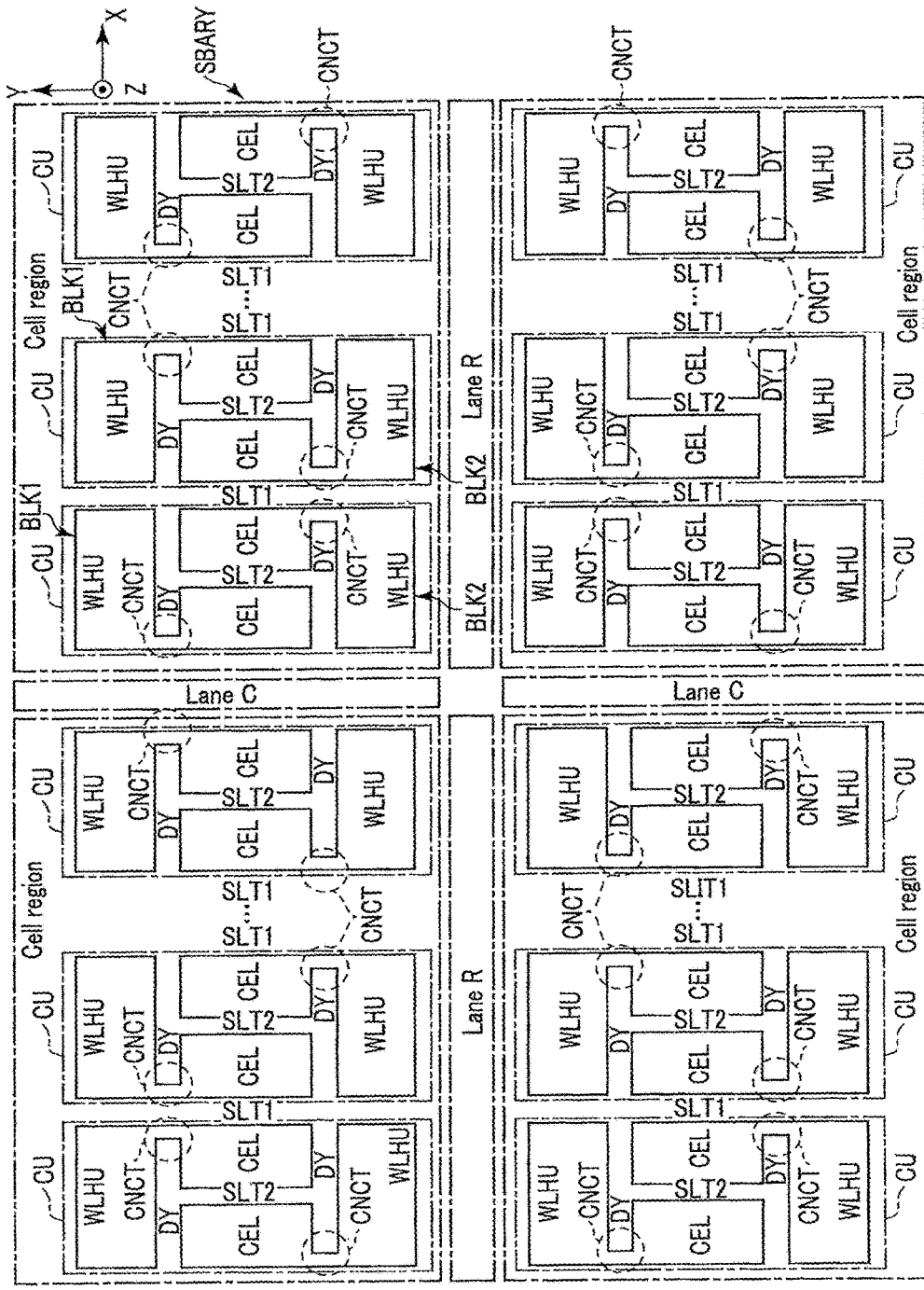
FIG. 9 is a planar layout diagram of a sub-array according to the first embodiment.

FIG. 9 shows one of the sub-arrays SBARY shown in FIG. 5, and shows the structure of each cell region in more detail. As shown in FIG. 9, each cell region included in the sub-array SBARY includes a plurality of cell units CU. Each cell unit CU includes two blocks ELK (block 1 and block 2). Each block BLK includes a cell portion CEL, a word line hook-up portion WLHU, and the connecting portion CNCT.

The cell portion CEL is a stacked structure including the source line SL, the selection gate lines SGS and SGD, and the word lines WL described with reference to FIG. 8. The cell portion CEL includes the memory hole therein and is for NAND string formed therein.

The hook-up portion WLHU is a region used to form contact plugs on the word lines WL and the selection gate line SGS. Each word line WL is electrically connected to the transistor 50 of the row decoder RD via the contact plug. Note that the selection gate line SGD is not provided in the hook-up portion WLHU. This is because, as shown in FIG. 8, the selection gate line SGD is connected to the transistor 50 of the row decoder RD via the trench DY in the cell region, as will be described later in detail.

The connecting portion CNCT is a region used to physically connect the word lines WL and the selection gate line in the cell portion CEL and the word lines WL and the selection gate line SGS in the hook-up portion WLHU.

Additionally, in each block BLK, the cell portion CEL, the connecting portion CNCT, and the hook-up portion WLHU are arranged along the Y direction. At this time, the cell portion CEL, the connecting portion CNCT, and the hook-up portion WLHU are arranged along the Y direction in this order in one block BLK, whereas the hook-up portion WLHU, the connecting portion CNCT, and the cell portion CEL are arranged in this order in the other block BLK.

In each cell unit CU, the two cell portions CEL are adjacent to each other in the X direction. The two cell portions CEL are physically separated by a slit SLT2 provided along the Y direction. The slit SLT2 has a structure in which an insulating layer is buried in a trench extending through the selection gate lines SGS and SGD and the word lines WL in the cell portion CEL.

In addition, the two hook-up portions WLHU in each cell unit CU are arranged to face each other in the Y direction across the two cell portions CEL arranged in the X direction. The width of each hook-up portion WLHU almost equals, for example, the width of the two cell portions CEL along the X direction and the width of the slit SLT2 along the X direction. The hook-up portion WLHU and the cell portion CEL which are adjacent in the Y direction are physically separated by the trench DY provided along the X direction. The trench DY has a structure in which an insulating layer is buried in a trench extending through the source line SL, the selection gate lines SGS and SGD, and the word lines WL.

The connecting portion CNCT is provided between the cell portion CEL and the hook-up region WLHU which belong to the same block. By the connecting portion CNCT, as described above, the selection gate line SGS and the word lines WL in the cell portion CEL are physically connected to the selection gate line SGS and the word lines WL in the hook-up region WLHU which belong to the same block BLK. Note that the width of the connecting portion CNCT along the X direction is made smaller than the width of the cell portion CEL along the X direction. Hence, the trench DY exists between the cell portion CEL and the hook-up portion WLHU in the same block BLK as well. In other words, in a given cell unit CU, of the two ends of the cell portion CEL along the Y direction, the end facing the hook-up portion WLHU belonging to the block BLK different from that of the cell portion CEL wholly faces the trench DY. On the other hand, the end facing the hook-up portion WLHU belonging to the same block BLK as that of the cell portion CEL (in other words, the hook-up portion physically connected to the cell portion CEL by the connecting portion CNCT) only partially faces the trench DY (the remaining region is connected to the connecting portion CNCT). In other words, the structure of the block BLK viewed on the X-Y plane has a shape constricted in the connecting portion CNCT.

In each cell region, the plurality of cell units CU each having the above-described structure are physically separated by slits SLT1 provided along the Y direction. The slit SLT1 has a structure in which an insulating layer is buried in a trench extending through the selection gate lines SGS and SGD and the word lines WL, and is provided from the end of the hook-up portion WLHU of one block BLK in the cell unit CU to the end of the hook-up portion WLHU of the other block BLK through the cell portion CEL. Note that the trench DY is formed to extend from the selection gate line SGD through the source line SL. However, the slits SLT1 and SLT2 need only separate the selection gate line SGD and the word lines WL, and the source line SL may be not separated.

The cell units CU adjacent to each other across the slit SLT1 have linearly symmetric shapes on the X-Y plane with respect to the slit SLT1. That is, when focus is placed on two given cell units CU, the block BLK1 of one cell unit CU is arranged such that the trench DY of the block faces the trench DY of the block BLK1 of another cell unit CU adjacent in the X direction. In this region, the two trenches DY facing each other are formed by an etching step performed such that the slits SLT1 cross and burying an insulating layer in the trenches formed by the etching step. The cell portions CEL of the blocks BLK1 are provided so as to face across the cell portions CEL of other blocks BLK2.

On the other hand, the blocks BLK2 are arranged such that the connecting portions CNCT and the cell portions CEL face across the slit SLT1 and the cell portions CEL face across the slit SLT1. Conversely, the connecting portions CNCT exist between the trenches DY of the two blocks BLK2. Hence, the trenches DY of the two blocks BLK2 are formed as physically different trenches in the etching step, unlike the above-described blocks BLK1.

The slit SLT1 is also provided between the cell regions adjacent in the X direction. This region is the lane C. The slit SLT1 provided in the lane C has a structure extending through the source line SL as well. The lane C is provided along the Y direction between the cell regions.

In addition, a region in which the source line SL, the selection gate lines SGS and SGD, and the word lines WL are removed is provided between the cell regions adjacent in the Y direction as well, and an insulating layer is buried in the removed region. This region is the lane R. The lane R is provided along the X direction between the cell regions.

Figure 11:
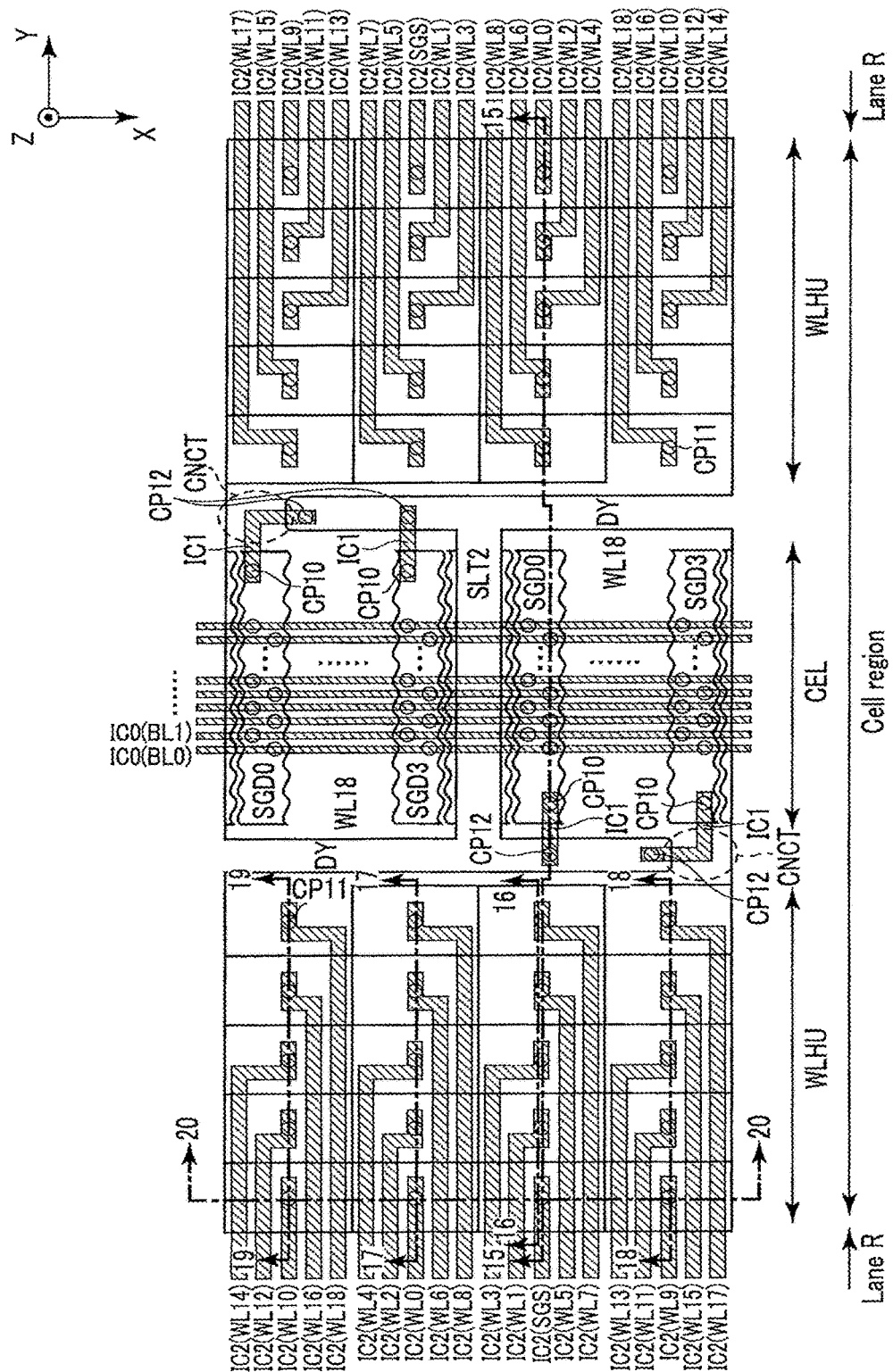

The planar structure of the cell region will be described in more detail with reference to FIGS. 10 and 11. FIG. 10 shows the planar layout of two cell units CU, and FIG. 11 shows interconnect layers formed by interconnects above cells in FIG. 10. Note that in FIG. 10, contact plugs CP12 formed in the trenches DY are not illustrated.

The cell portion CEL will be described first. As shown in FIGS. 10 and 11, in the cell portion CEL, the selection gate line SGS and the word lines WL each having a flat plate shape spreading on the X-Y plane are stacked, and the word line WL18 is provided in the uppermost layer of the stacked structure of the word lines WL. The selection gate lines SGD (SGD0 to SGD3) each having a stripe shape whose longitudinal direction is parallel to the Y direction are provided on the word line WL18. Each side surface of the selection gate lines SGD has an uneven shape on the X-Y plane and, more specifically, a wavy shape. The silicon pillars MH described with reference to FIG. 8 are formed on each selection gate line SGD. The silicon pillars MH are formed to extend from the selection gate line SGD to the source line SL. Additionally, as shown in FIG. 10, the silicon pillars MH are provided in a staggered pattern on the selection gate line SGD.

Metal interconnect layers IC0 each having a stripe shape along the X direction are formed on the silicon pillars MH. The metal interconnect layers IC0 correspond to the interconnects D1 above cells described with reference to FIG. 8, and function as the bit lines BL.

In addition, of the two ends of each selection gate line SGD along the Y direction, the end close to the connecting portion CNCT is provided with a contact plug CP10. The contact plug CP10 is used to connect the selection gate line SGD to the transistor 50 of the row decoder RD and, more specifically, used to connect the conductive layer functioning as the selection gate line SGD to the interconnect D1 above the cell. Furthermore, a contact plug CP12 is provided in the trench DY. In addition, a metal interconnect layer IC1 that connects the contact plugs CP10 and CP12 is formed using the interconnect D1 above the cell. The contact plug CP12 is formed in the insulating layer in the trench DY and connected to the interconnect M1 under the cell. The selection gate line SGD is electrically connected to the transistor 50 of the row decoder RD via the contact plugs CP10 and CP12 and the interconnect layer IC1.

Note that the contact plugs CP10 provided in the cell portion CEL belonging to a given block BLK are connected to the contact plugs CP12 provided in the trench DY between the cell portion CEL and the hook-up portion WLHU belonging to the same block ELK. That is, the cell portion CEL is in contact with the trenches DY at the two ends along the Y direction. The contact plugs CP10 are connected to the contact plugs CP12 provided in one of the two trenches DY, which is closer to the contact plugs CP10.

Additionally, in the example shown in FIGS. 10 and 11, the contact plugs CP12 are not provided in the trench DY between a given cell portion CEL and the hook-up portion WLHU belonging to the block BLK different from the block BLK to which the cell portion CEL belongs. However, some of the contact plugs CP12 may be provided in the trench DY.

The hook-up portion WLHU will be described next. As shown in FIGS. 10 and 11, the selection gate line SGS and the word lines WL each having a flat plate shape spreading on the X-Y plane are stacked in the hook-up portion WLHU as well. The hook-up portion WLHU includes, for example, (5×4) rectangular regions, and in each region, the surfaces of the selection gate line SGS and the word lines WL0 to WL18 are exposed. In the example shown in FIGS. 10 and 11, the interconnect layers are exposed at intervals of one layer in each column.

More specifically, in a given column (this will be referred to as a first column), the upper surfaces of the selection gate line SGS and the word lines WL1, WL3, WL5, and WL7 are exposed. In a column (this will be referred to as a second column) adjacent to the first column, the upper surfaces of the word lines WL0, WL2, WL4, WL6, and WL8 are exposed. In a column (this will be referred to as a third column) adjacent to the second column across the first column, the upper surfaces of the word lines WL9, WL11, WL13, WL15, and WL17 are exposed. In a column (this will be referred to as a fourth column) adjacent to the first column across the second column, the upper surfaces of the word lines WL10, WL12, WL14, WL16, and WL18 are exposed.

Additionally, in each column, the interconnect layer located on the upper layer is exposed in a region closer to the connecting portion CNCT. That is, in the row closest to the connecting portion CNCT, the upper surfaces of the word lines WL7, WL8, WL17, and WL18 are exposed. In the row farthest from the connecting portion CNCT, the upper surfaces of the selection gate line SGS and the word lines WL0, WL9, and WL10 are exposed.

A contact plug CP11 is formed on each of the (5×4) regions. The contact plugs CP11 are connected to metal interconnect layers IC2 formed using the interconnects D1 above the cells. The metal interconnect layers IC2 are extracted from the hook-up portion WLHU to the lane R. The metal interconnect layers IC2 are then connected to the transistors 50 of the row decoder RD in the lane R (this will be described later).

<Planar Structure of Lane R>

Figure 12:
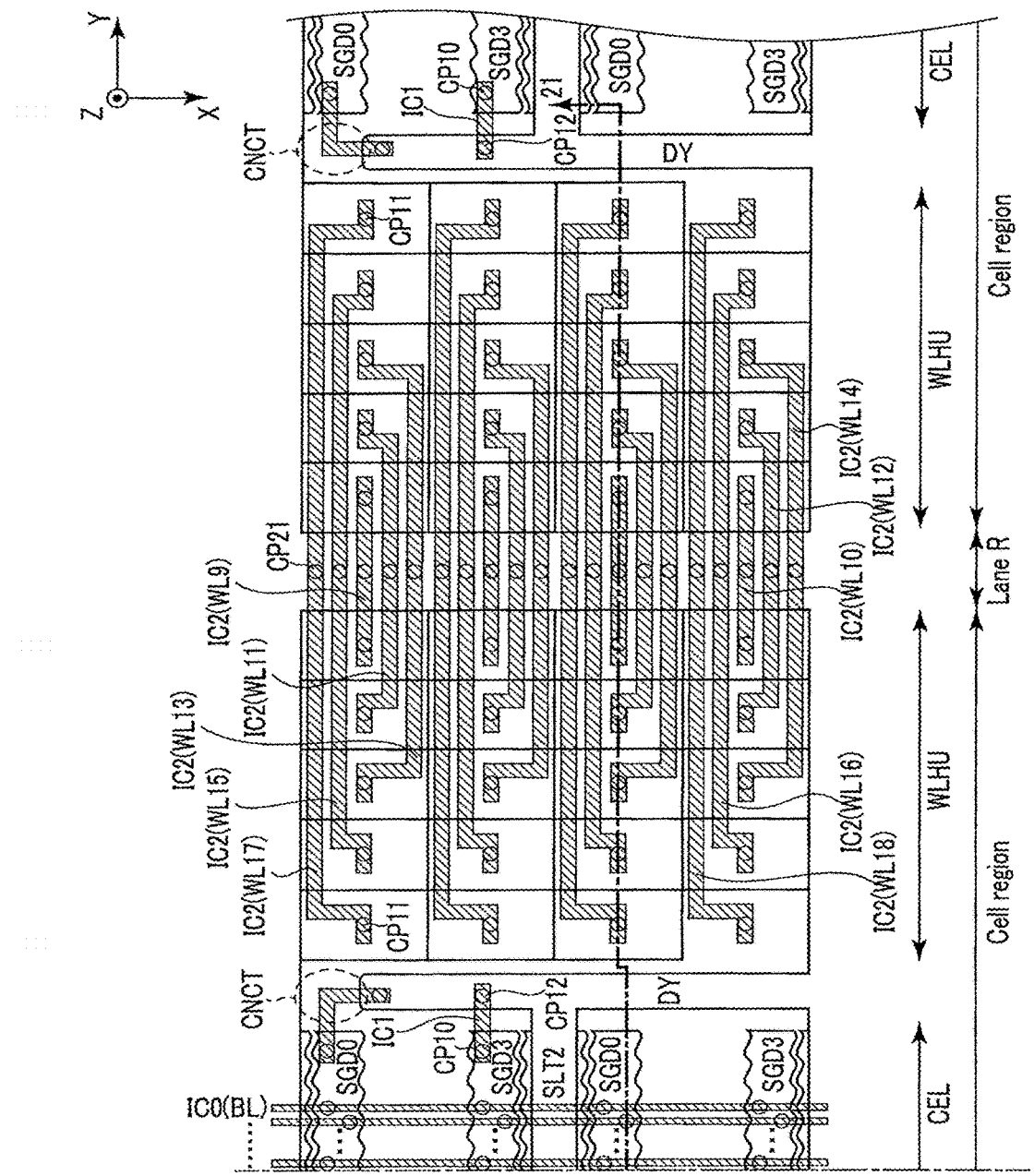
FIG. 12 is a planar layout diagram of cell regions and a lane R according to the first embodiment.

Details of the planar structure of the lane R will be described next with reference to FIGS. 12 and 13. FIGS. 12 and 13 show the planar layout (X-Y plane) of three cell portions CEL and two lanes R located between them. The dot dashed line at the end in the Y-axis direction in FIG. 12 and the dot dashed line at the end in the Y-axis direction in FIG. 13 represent the same position.

As described with reference to FIG. 9, in the lane R, the hook-up portions WLHU in the cell regions adjacent in the Y direction face each other. In the lane R, the metal interconnect layers IC2 formed in one hook-up portion WLHU are connected to the metal interconnect layers IC2 formed in the other hook-up portion WLHU. In addition, contact plugs CP21 are provided in the insulating layer provided in the lane R. The contact plugs CP21 are used to connect the word lines WL to the transistors 50 of the row decoder RD and, more specifically, used to connect the metal interconnect layers IC2 connected to the word lines WL to the interconnects M1 under the cells. The contact plugs CP21 are connected to the corresponding metal interconnect layers IC2 and further connected to the interconnects M1 under the cells. The selection gate line SGS and the word lines WL are electrically connected to the transistors 50 of the row decoder RD via the interconnect layers IC2 and the contact plugs CP21.

That is, of the selection gate lines SGS and SGD and the word lines WL stacked in the cell portion CEL, the selection gate line SGD is electrically connected the region under the memory cell array via the contact plug CP12 formed in the trench DY provided in the cell portion CEL. On the other hand, the selection gate line SGS and the word lines WL are electrically connected the region under the memory cell array via the contact plugs CP21 formed in the lane R.

Note that in the lane C, the bit line BL is electrically connected to the region under the memory cell array. The planar structure of the lane C is almost the same as that of the lane R, and a detailed description thereof will be omitted.

1.2.2.2 Sectional Structure of Sub-Array SBARY

Details of the sectional structure of the sub-array SBARY described concerning the planar structure will be described next.

<Sectional Structure of Cell Region>

Figure 14:
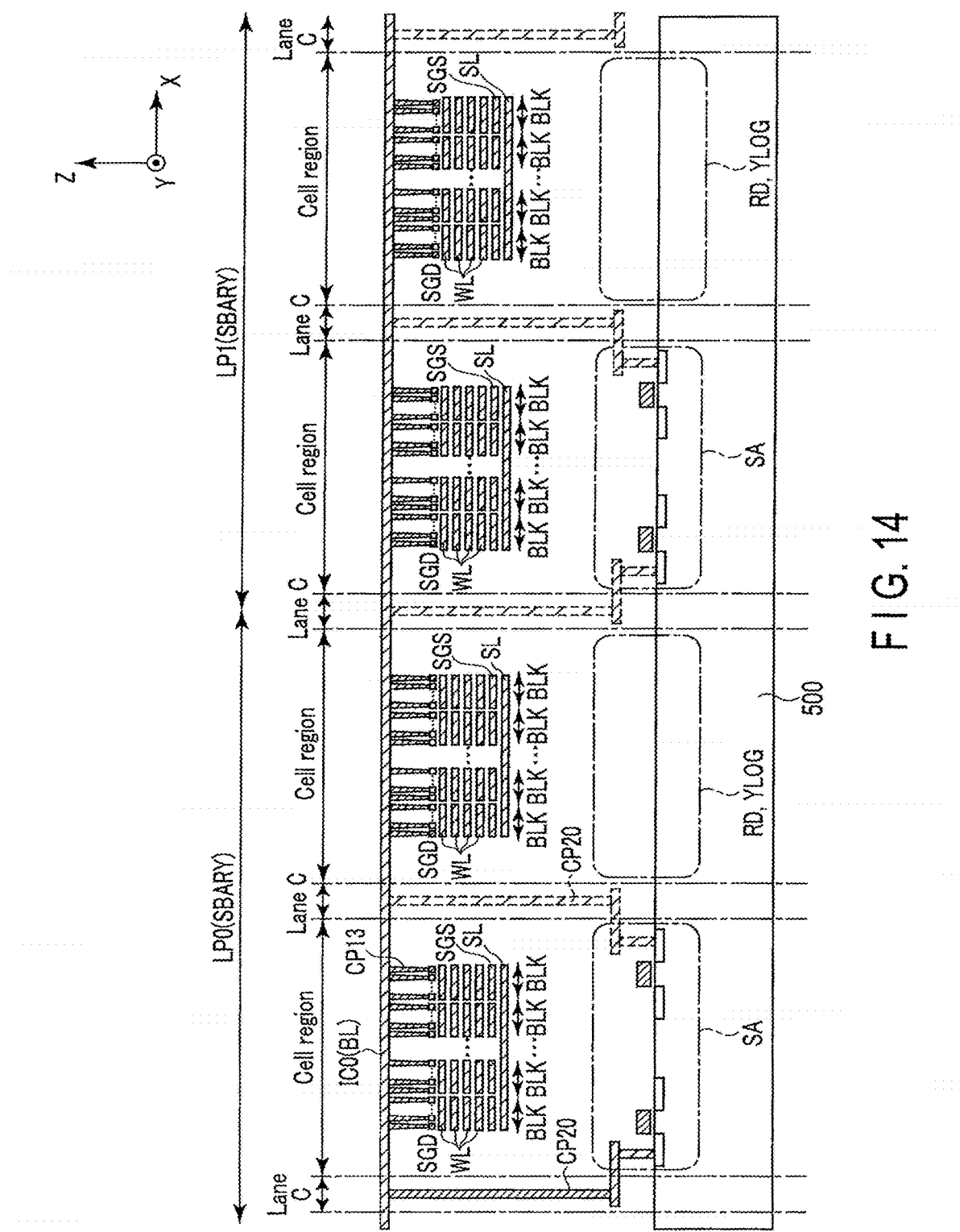
FIG. 14 is a sectional view taken along a line 14-14 in FIG. 6.
Figure 15:
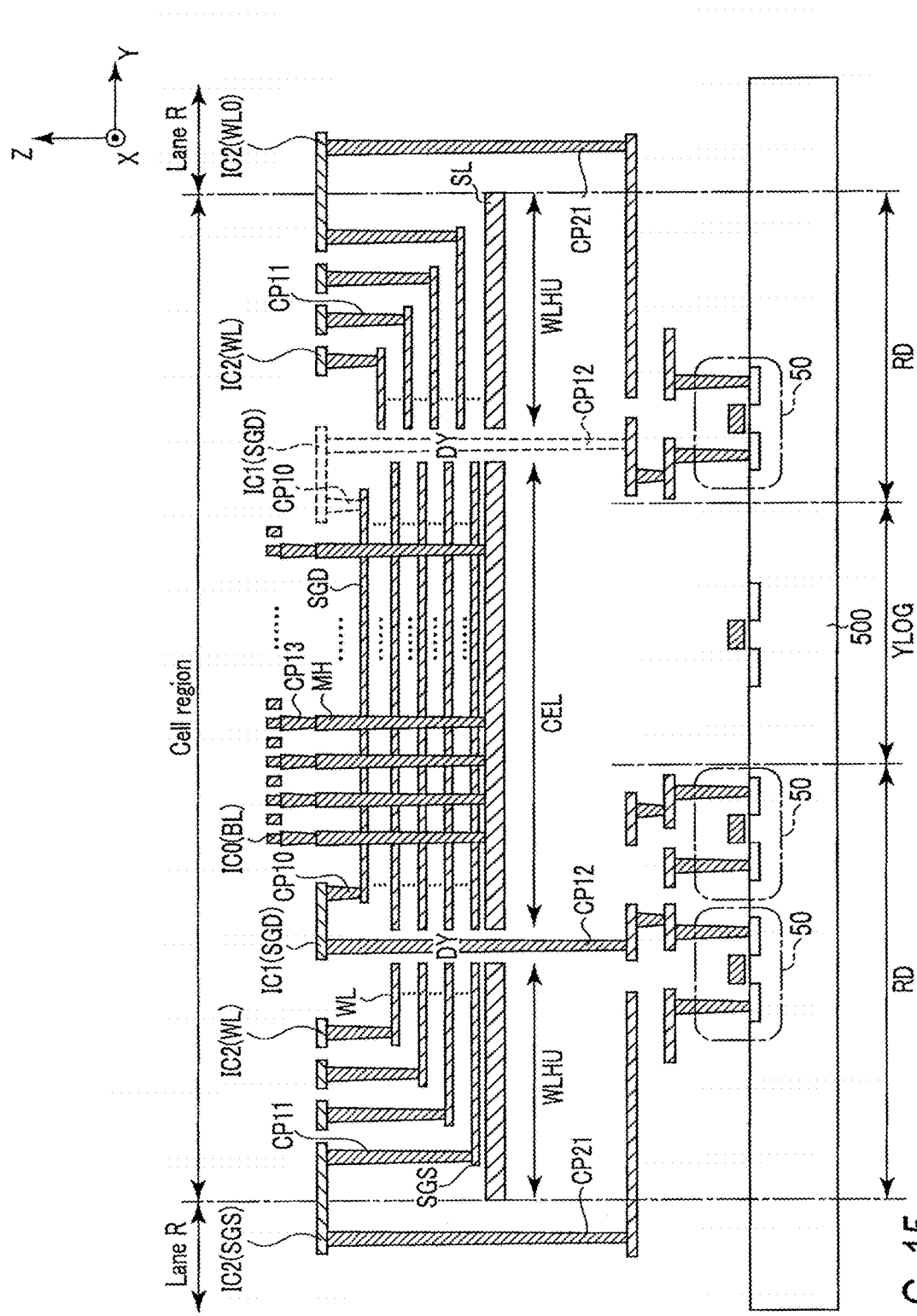
FIG. 15 is a sectional view taken along a line 15-15 in FIG. 11.
Figure 18:
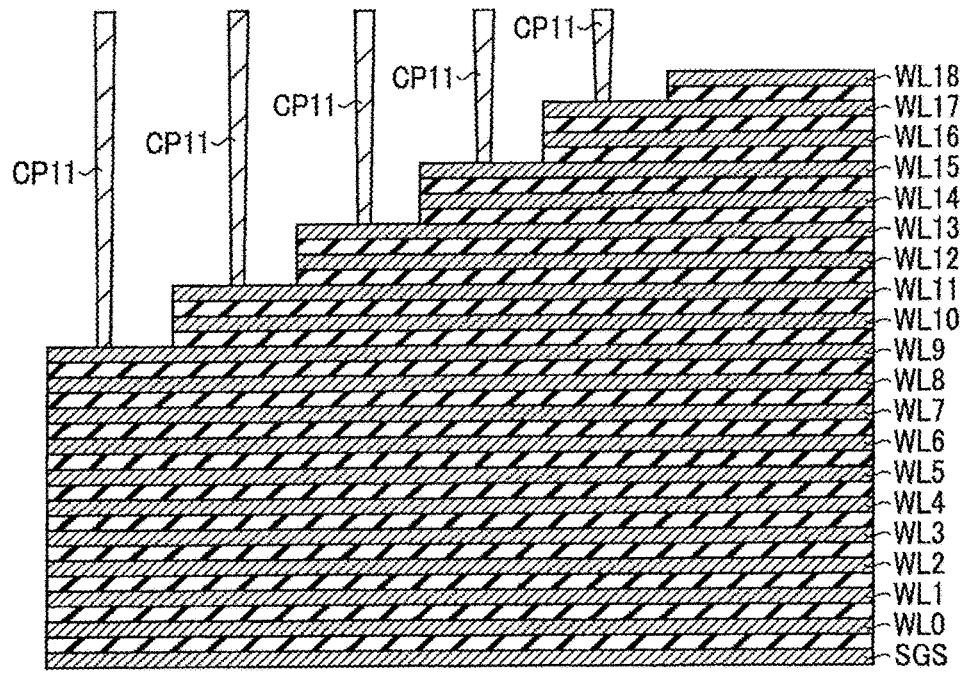
Figure 19:
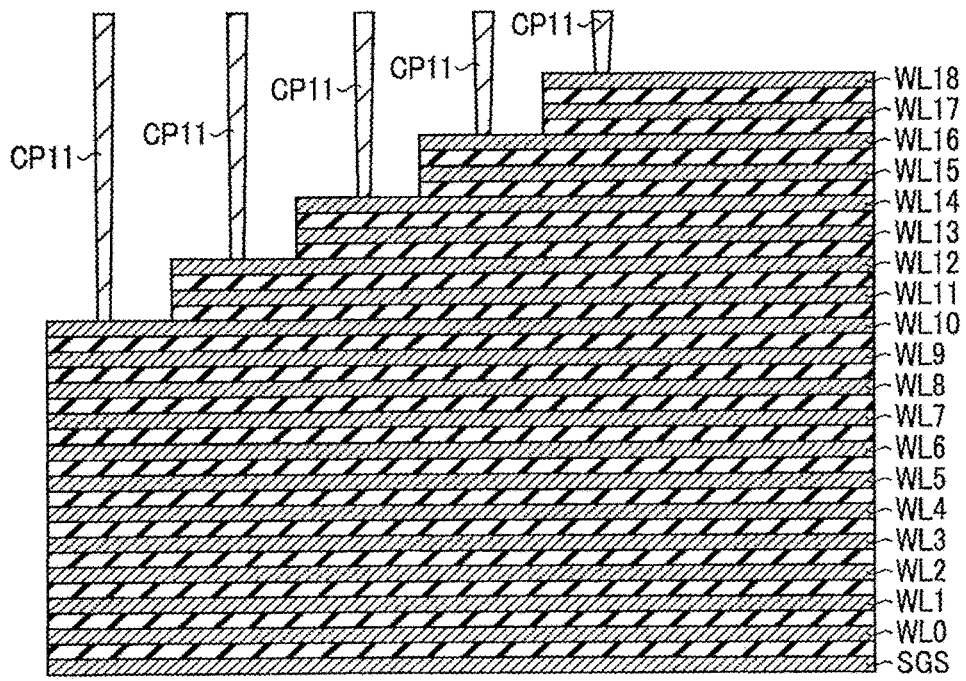
Figure 20:
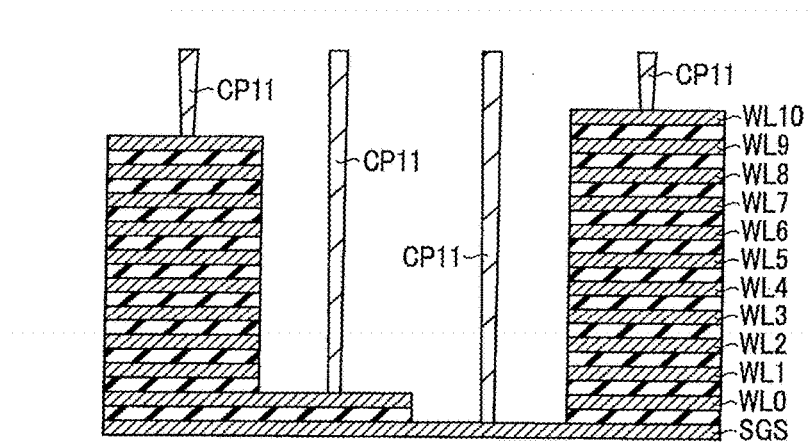

The sectional structure of the cell region will be described first. FIG. 14 is a sectional view taken along a line 14-14 in FIG. 6. FIG. 15 is a sectional view taken along a line 15-15 in FIG. 11.

As described above, the row decoder 120 and the sense amplifier 140 are formed on the semiconductor substrate 500, and the cell regions are formed in a region above them. In the cell portion, first, the source line SL is provided on an interlayer dielectric film (not shown), the selection gate line SGS is formed above the source line SL, the plurality of word lines WL are stacked above the selection gate line SGS, and the selection gate line SGD is provided above them. The interconnect layers are electrically isolated by insulating layers.

In addition, the silicon pillars MH are provided so as to extend up to the source line SL through the selection gate line SGD and the word lines WL. Contact plugs CP13 are provided on the silicon pillars MH, and the interconnect layers IC0 functioning as the bit lines BL are provided on the contact plugs CP13.

The hook-up portion WLHU will be described with reference to FIG. 15. In the hook-up portion WLHU as well, the source line SL is provided on the interlayer dielectric film that covers the row decoder 120 and the sense amplifier 140, the selection gate line SGS is formed above the source line SL, and the plurality of word lines WL are stacked above the selection gate line SGS, as in the cell portion CEL. In the hook-up portion WLHU, the end of each of the selection gate line SGS and the word lines WL facing the lane R has a step shape. That is, the interconnects in the lower layer is long along the Y direction and has a region that does not overlap the interconnects in the upper layer.

FIGS. 16, 17, 18, 19, and 20 show this state. FIGS. 16, 17, 18, 19, and 20 are sectional views taken along a line 16-16, a line 17-17, a line 18-18, a line 19-19, and a line 20-20 in FIG. 11. As shown in FIGS. 16, 17, 18, 19, and 20, the regions where the interconnects in the lower layer and the interconnects in the upper layer do not overlap correspond to the (5×4) regions described with reference to FIG. 10 where the contact plugs CP11 are formed. Note that although not illustrated in FIGS. 16, 17, 18, 19, and 20, an insulating layer is buried around the contact plugs CP11, and the contact plugs CP11 are electrically insulated from each other.

The trench DY will be described next. As shown in FIG. 13, the trench DY physically separates the source line SL, the selection gate line SGS, and the word lines WL between the cell portion CEL and the hook-up portion WLHU. As described above, an insulating layer is buried in the trench DY. The contact plugs CP12 are formed in the insulating layer. The contact plugs CP12 extend from the level of the interconnects D1 (metal interconnect layers IC1) above the cells to the level of the interconnects M1 under the cells. The contact plugs CP12 are further connected to the transistors 50 of the row decoder RD via the interconnects M0 under the cells. The transistors 50 are located immediately under the corresponding cell regions.

<Sectional Structure of Lane C>

The sectional structure of the lane C will be described next with reference to FIG. 14. As described above, in the lane C, the stacked structure from the source line SL to the selection gate line SGD is removed, and an insulating layer is buried, as in the lane R. In the lane C, contact plugs CP20 are provided in the insulating layer.

As shown in FIG. 14, the contact plugs CP20 extend from the level of the interconnects D1 (metal interconnect layers IC0: bit lines BL) above the cells to the level of the interconnects M1 under the cells. The contact plugs CP20 are further connected to the transistors 14 of the sense amplifiers SA via the interconnects M0 under the cells. The sense amplifiers 14 are located immediately under the corresponding cell regions.

<Sectional Structure of Lane R>

Figure 21:
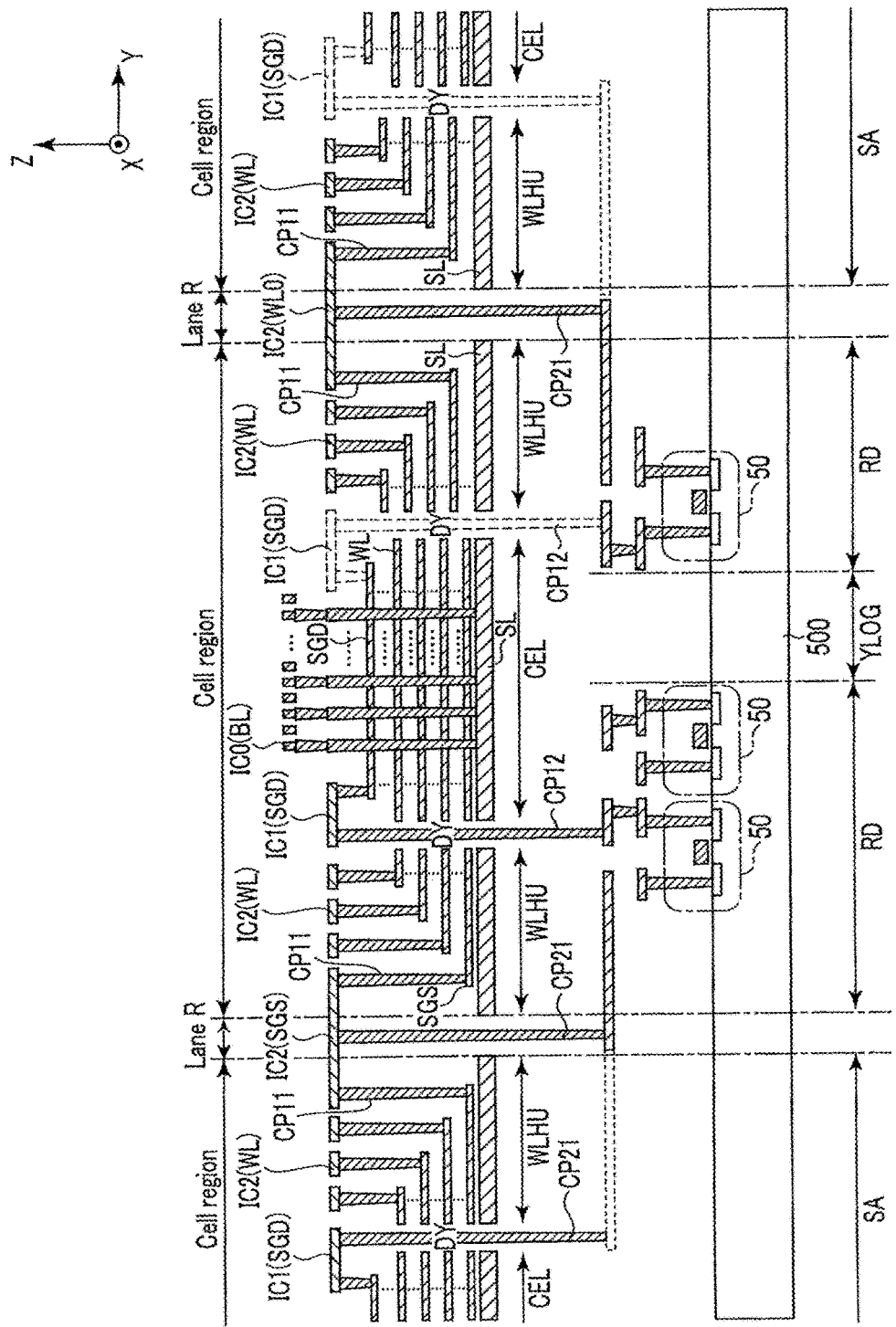
FIG. 21 is a sectional view taken along a line 21-21 in FIGS. 12 and 13.

The sectional structure of the lane R will be described next with reference to FIG. 21. FIG. 21 is a sectional view taken along a line 21-21 in FIGS. 12 and 13. As described above, in the lane R, the stacked structure from the source line SL to the selection gate line SGD is removed, and an insulating layer is buried. In the lane R, the contact plugs CP21 are provided in the insulating layer.

Additionally, as shown in FIG. 21, the selection gate lines SGS and the word lines WL facing across the lane R are commonly connected to the metal interconnect layers IC2 via the contact plugs CP11. In the lane R, the metal interconnect layers IC2 are connected to the contact plugs CP21.

The contact plugs CP20 extend from the level of the interconnects D1 (metal interconnect layers IC2) above the cells to the level of the interconnects M1 under the cells. The contact plugs CP20 are further connected to the transistors 50 of the row decoder RD via the interconnects M0 under the cells. The transistors 50 are also located immediately under the corresponding cell regions, like the transistors 50 connected to the selection gate lines SGD.

Note that the contact plugs CP21 formed in the trench DY in the cell region located above the sense amplifier SA are also electrically connected to the row decoders RD located immediately under the adjacent cell region by the interconnects M1 or M0 under the cells via the region under the lane R.

1.2.2.3 Connection Relationship in Lane R and Lane C

As described 1.2.2.1 and 1.2.2.2, the selection gate line SGS and the word lines WL are extracted in the lane R up to the region under the memory cell array and connected to the row decoder RD. Further, the bit lines BL are extracted in the lane C up to the region under the memory cell array and connected to the sense amplifier SA. Furthermore, the selection gate lines SGD are extracted in the trench DY in the cell region up to the region under the memory cell array and connected to the row decoder RD.

The cell regions include cell regions with the row decoders RD existing immediately under them and cell regions with the sense amplifiers SA existing immediately under them. Hence, when the row decoder RD exists immediately under the cell region, the selection gate lines SGS and SGD the word lines WL are connected to the row decoder RD.

However, when not the row decoder RD but the sense amplifier SA exists, the selection gate lines SGS and SGD the word lines WL are connected to the row decoder RD immediately under the adjacent cell region.

In addition, the plurality of lanes C are provided in the memory cell array. Each bit line BL is connected to the sense amplifier SA in one of the plurality of lanes C, and the connecting portions between the bit lines BL and the sense amplifier SA are distributed.

Figure 22:
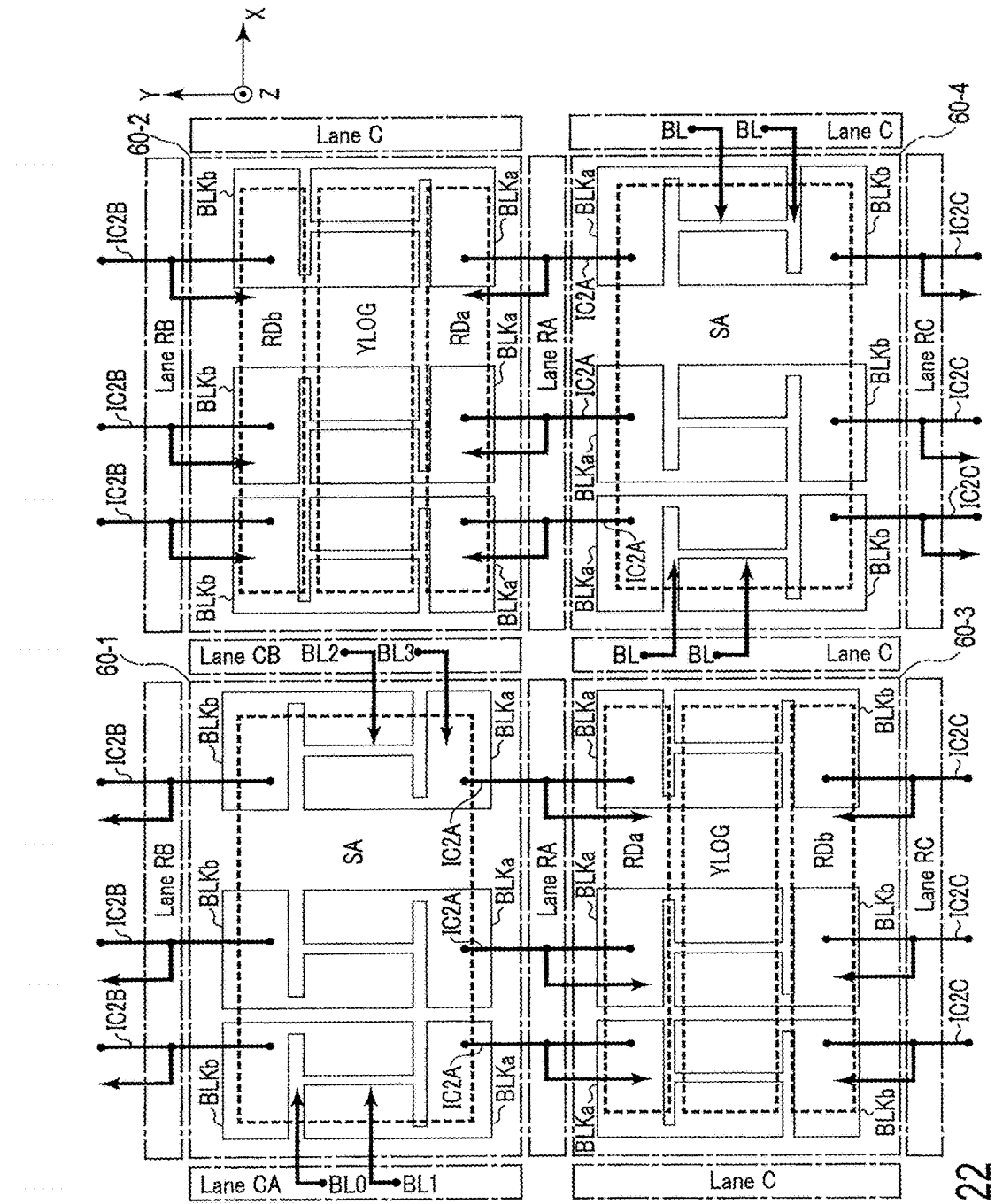
FIG. 22 is a layout diagram showing the connection relationship between word lines and row decoders according to the first embodiment.

The above-described point will be described with reference to FIG. 22. FIG. 22 shows the planar layout of the sub-array SBARY. As shown in FIG. 22, the sub-array SBARY includes the cell regions 60-1 to 60-4. The sense amplifier SA is provided immediately under each of the cell regions 60-1 and 60-4. The set of the row decoders RD and the arithmetic circuit YLOG is provided immediately under each of the cell regions 60-2 and 60-3.

Blocks BLKa in the cell region 60-1 and the blocks BLKa in the cell region 60-3 face each other across a lane RA. The word lines WL and the selection gate lines SGS in these blocks are connected to each other by metal interconnect layers IC2A and connected, via the lane RA, to a row decoder RDa (transistors 50) immediately under the cell region 60-3. In addition, the selection gate lines SGD in the blocks BLKa in the cell region 60-1 and the selection gate lines SGD in the blocks BLKa in the cell region 60-3 are also connected, via the trench DY, to the row decoder RDa immediately under the cell region 60-3. That is, the two blocks BLKa share the transistors 50.

The word lines WL and the selection gate lines SGS in blocks BLKb that form the cell units CU together with the blocks BLKa in the cell region 60-3 are connected to the blocks BLKb in another sub-array SBARY adjacent in the Y-axis direction across a lane RC by metal interconnect layers IC2C, and connected, via the lane RC, to a row decoder RDb (transistors 50) immediately under the cell region 60-3. In addition, the selection gate lines SGD in the blocks BLKb are also connected, via the trench DY, to the row decoder RDb immediately under the cell region 60-3. That is, the two blocks BLKb share the transistors 50.

In addition, the word lines and the selection gate lines SGS in the blocks BLKb in the cell region 60-1 are connected to the blocks BLKb in another sub-array SBARY adjacent in the Y-axis direction across a lane RB by metal interconnect layers IC2B, and connected, via the lane RB, to the row decoder RDb immediately under the adjacent sub-array SBARY. In addition, the selection gate lines SGD in the blocks BLKb are also connected, via the trench DY, to the row decoder RDb immediately under the adjacent sub-array SBARY.

This also applies to the cell regions 60-2 and 60-4. That is, the blocks BLKa in the cell region 60-2 and the blocks BLKa in the cell region 60-4 face each other across the lane RA. The word lines WL and the selection gate lines SGS in these blocks are connected to each other by the metal interconnect layers IC2A and connected, via the lane RA, to the row decoder RDa immediately under the cell region 60-2. In addition, the selection gate lines SGD in the blocks BLKa in the cell region 60-2 and the selection gate lines SGD in the blocks BLKa in the cell region 60-4 are also connected, via the trench DY, to the row decoder RDa immediately under the cell region 60-2.

The word lines WL and the selection gate lines SGS in blocks BLKb in the cell region 60-2 are connected to the blocks BLKb in another sub-array SBARY adjacent in the Y-axis direction across the lane RB by the metal interconnect layers IC2B, and connected, via the lane RB, to the row decoder RDb immediately under the cell region 60-2. In addition, the selection gate lines SGD in the blocks BLKb are also connected, via the trench DY, to the row decoder RDb immediately under the cell region 60-2.

In addition, the word lines and the selection gate lines SGS in the blocks BLKb in the cell region 60-4 are connected to the blocks BLKb in another sub-array SBARY adjacent in the Y-axis direction across the lane RC by the metal interconnect layers IC2C, and connected, via the lane RC, to the row decoder RDb immediately under the adjacent sub-array SBARY. In addition, the selection gate lines SGD in the blocks BLKb are also connected, via the trench DY, to the row decoder RDb immediately under the adjacent sub-array SBARY.

In the lane C, the bit lines BL are connected to the sense amplifier SA. In the example shown in FIG. 22, of the bit lines BL0 to BL3 passing through the cell regions 60-1 and 60-2, the bit lines BL0 and BL1 are connected to the sense amplifier SA immediately under the cell region 60-1 via a lane CA. On the other hand, the bit lines BL2 and BL3 are connected to the sense amplifier SA immediately under the cell region 60-1 via a lane CB.

1.3 Effect According to this Embodiment

According to the arrangement of this embodiment, the block size of the memory cell array can be reduced. This effect will be described below.

In the NAND flash memory, since the block size may be a unit to, for example, erase data, reducing the block size may be required in some cases.

At this time, to exploit the advantage of a 3D-stacked memory in which the word lines WL is stacked, the number of string units may be decreased without decreasing the number of stacked word lines WL. In this case, however, although the block size may be reduced, the number of stacked word lines WL does not change. Hence, the size of the hook-up region of the word lines is almost the same as that before the reduction of the block size. Then, when the number of string units is simply decreased, a wasteful region may be generated, and the degree of integration may lower.

In this regard, according to the arrangement of this embodiment, as described with reference to FIGS. 9, 10, 11, 12, and 13, the blocks BLK are arranged such that the cell portions CEL are adjacent to each other in the X-axis direction, and the word line hook-up regions WLHU face each other in the Y-axis direction. Hence, according to this arrangement, it is possible to suppress generation of a wasteful unused region and reduce the block size while efficiently arranging the blocks BLK.

The planar structure of the block BLK according to this embodiment may be formed by, for example, the following etching steps performed after the interconnect layers functioning as the source line SL, the selection gate line SGS, the word lines WL, and the selection gate lines SGD are formed on the interlayer dielectric film 501. That is, the steps are (1) etching the interconnect layers, which is performed to form the lane C and the lane R, (2) etching the interconnect layers, which is performed to form the slit SLT1 that separates cell units in a cell region, (3) etching the interconnect layers, which is performed to form the slit SLT2 that separates cell portions in each cell unit CU, and (4) etching the interconnect layers, which is performed to form the trench DY in which a contact of the selection gate line SGD is provided in each cell unit CU.

Note that the order of the above-described etching steps may be changed as much as possible, and the plurality of etching steps may be performed simultaneously. In addition, in (2) and (3), the source line SL may be not etched.

As a result, the cell units CU adjacent in the Y-axis direction face each other in the hook-up region WLHU in any place. The word lines WL in the two hook-up regions WLHU facing each other are commonly connected in the lane R and connected to the row decoder RD. The trench DY is formed so as to cross the slits SLT1 and SLT2 and also cross the lane C.

Note that in this specification, the "word line WL" in the views of planar layouts and sectional structures means a conductive layer formed in the interlayer dielectric film 502 and located between a conductive layer functioning as a source line and the interconnect D1 in, for example, FIG. 8 or the like. This conductive layer is a conductive layer that contacts the memory hole MH via a gate insulating film, a charge accumulation layer, and a block insulating film. This also applies to the selection gate lines SGD and SGS. In other words, the word line WL means a plurality of conductive layers, for example, polysilicon layers stacked between a conductive layer functioning as the selection gate line SGS and a conductive layer functioning as the selection gate line SGD along the Z-axis direction.

2. Second Embodiment

A semiconductor memory device according to the second embodiment will be described next. This embodiment is directed to the arrangement of a row decoder RD provided at an end of a memory cell array 110 according to the first embodiment. Only points different from the first embodiment will be described below.

2.1 Planar Layout of Region under Memory Cell Array

Figure 23:
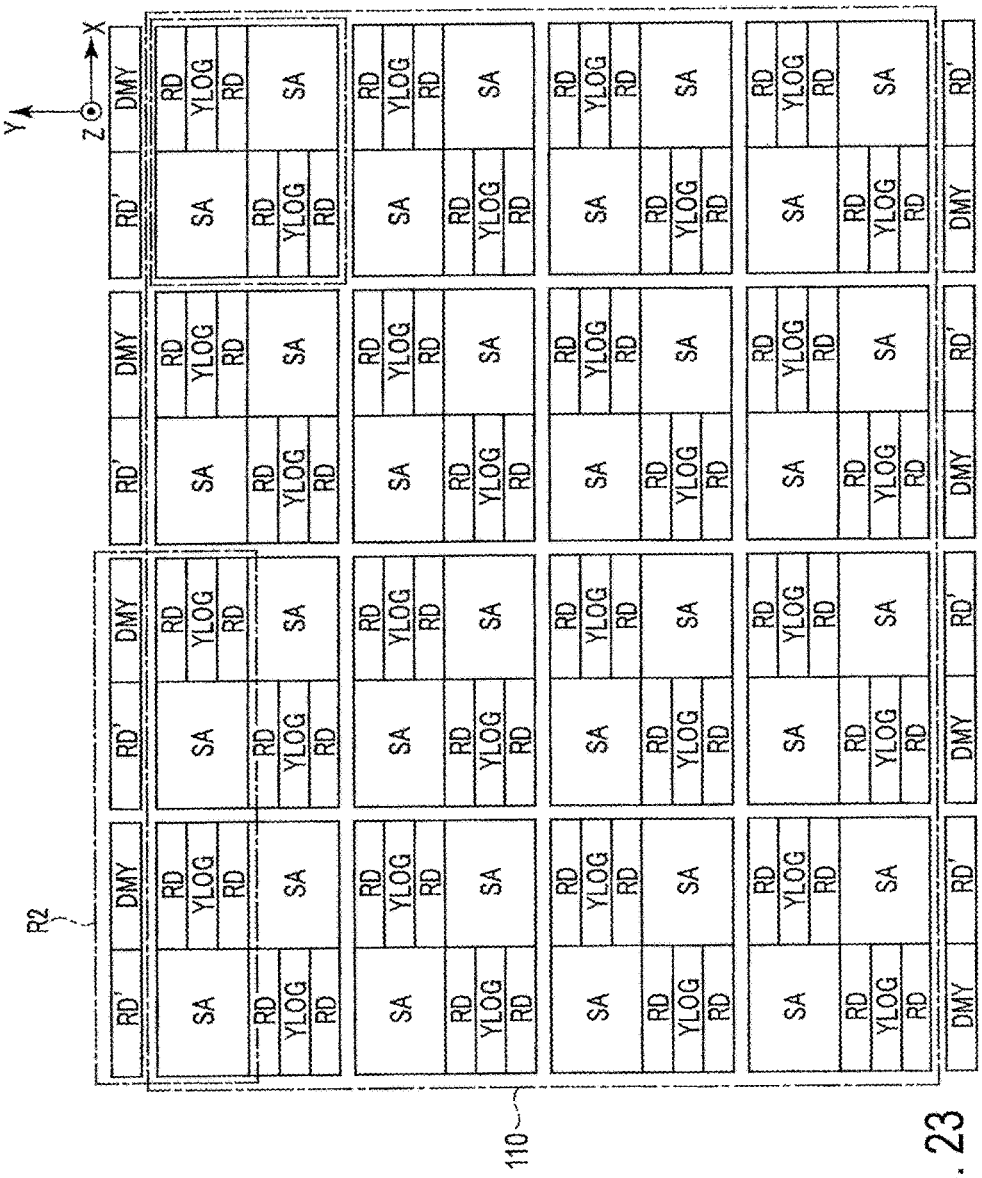
FIG. 23 is a planar layout diagram of a region under a memory cell array according to the second embodiment.

FIG. 23 shows the planar layout of a region under the memory cell array according to this embodiment, in other words, the planar layout of sense amplifiers SA, the row decoders RD, and arithmetic circuits YLOG.

As shown in FIG. 23, row decoders RD' and dummy regions DMY are provided in a region adjacent to the region overlapping the memory cell array 110 in the Y-axis direction. The row decoders RD' are provided in regions adjacent to the sense amplifiers SA, and the dummy regions DMY are provided in regions adjacent to the row decoders RD.

Figure 24:
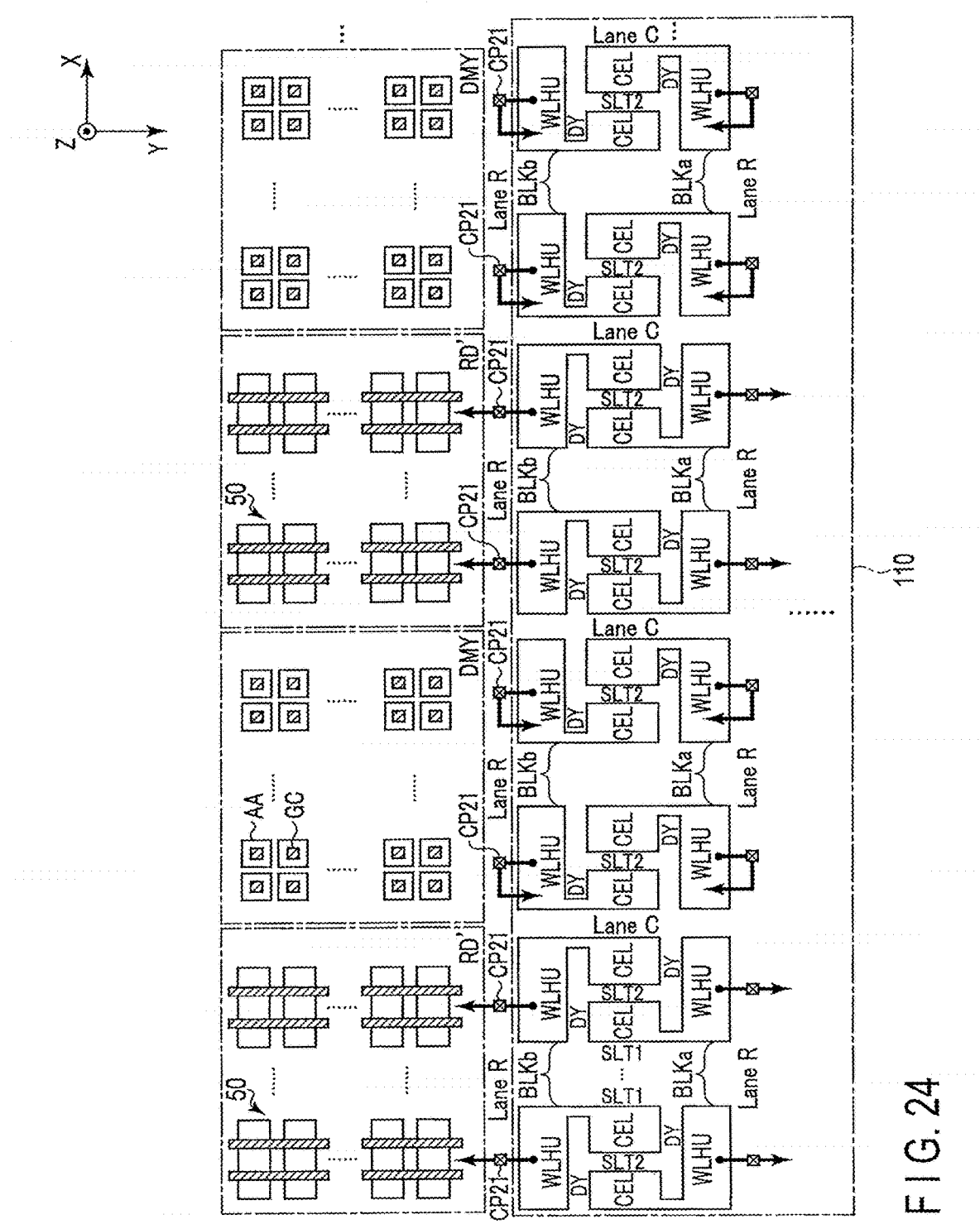
FIG. 24 is a planar layout diagram showing a region R2 in FIG. 23 in detail.

FIG. 24 shows a region R2 in FIG. 23 in detail. As shown in FIG. 24, each row decoder RD' includes transistors 50, and has the same arrangement as the row decoder RD provided in the region overlapping the memory cell array 110. The row decoder RD' is connected, via a lane R, to word lines WL and selection gate lines SGS in blocks BLKb provided above the sense amplifier SA adjacent to the row decoder RD' in the Y-axis direction.

On the other hand, dummy element regions AA and gate electrodes (semiconductor layers) GC are formed in each dummy region DMY. These elements are provided to prevent an etching pattern from largely collapsing at the etching for forming, for example, the row decoders RD and RD' or the sense amplifiers SA, and do not particularly function as effective semiconductor elements.

2.2 Effect According to this Embodiment

In a case in which the block layout described in the first embodiment is used, to connect the word lines WL in the blocks BLKb in the cell region located on the sense amplifier SA to the row decoder RD immediately under the cell region, for example, the interconnects under the cells across the sense amplifier SA. In this regard, according to this embodiment, the row decoders RD' for the blocks BLKb are provided outside the memory cell array, thereby suppressing congestion of the interconnects under the cells.

In addition, basically, the sense amplifiers SA and the row decoders RD overlap the memory cell array 110 in the Z-axis direction. When viewed on the X-Y plane, the sense amplifiers SA and the row decoders RD are covered with the memory cell array 110 and are invisible. However, according to this embodiment, it is possible to see a state in which the row decoders RD' each having almost the same width as a cell region 60 along the X-axis direction are formed at the same repetitive period along the X-axis direction.

Furthermore, the dummy region DMY is preferably provided between the row decoders RD' that are adjacent to each other. The dummy element regions AA and the gate electrodes GC in the dummy region DMY may be set in an electrically floating state. Alternatively, they may be fixed to a predetermined potential (for example, 0 V) or may be electrically independent of the row decoders RD and RD' and the sense amplifiers SA on the periphery.

3. Third Embodiment

A semiconductor memory device according to the third embodiment will be described next. In this embodiment, a loop-shaped stacked structure that surrounds the periphery of each cell region is formed in the first and second embodiments. Only points different from the first and second embodiments will be described below.

3.1 Planar Layout

Figure 25:
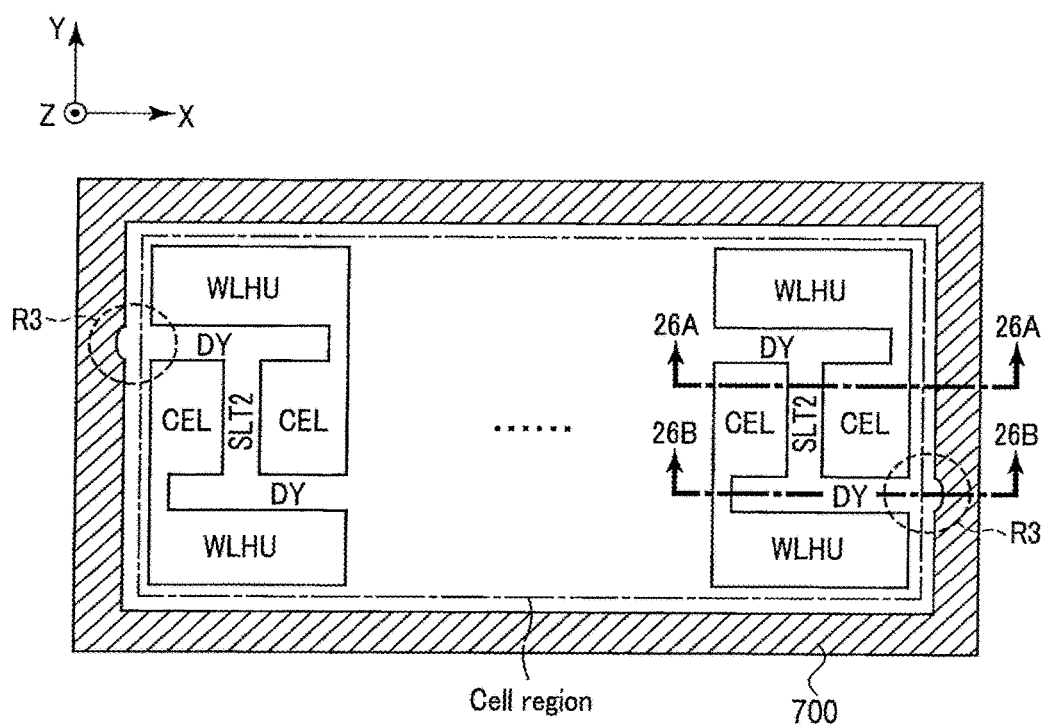
FIG. 25 is a planar layout diagram of a cell region according to the third embodiment.

FIG. 25 shows the planar layout of a cell region and a stacked structure provided on the periphery of it.

As shown in FIG. 25, a loop-shaped stacked structure 700 is provided on the periphery of the cell region so as to surround the cell region. Like, for example, a cell portion CEL, the stacked structure 700 has a structure in which conductive layers formed in the same layers as interconnect layers functioning as a source line SL, as selection gate line SGS, word lines WL, and selection gate lines SGD are stacked. The interval between the stacked structure 700 and an adjacent cell unit CU is, for example, almost the same as the width of a slit SLT1, a lane C, or a lane R. This region is filled with, for example, an insulating film, and the cell region and the stacked structure 700 are electrically isolated.

The stacked structure 700 includes a recess in each side wall on a side facing the cell region. This recess is formed in a region facing a trench DY in the X-axis direction, as shown as a region R3 in FIG. 25. The recess is formed from the uppermost layer to the lowermost layer of the stacked structure 700, and the inside is filled with, for example, an insulating film.

Figure 26:
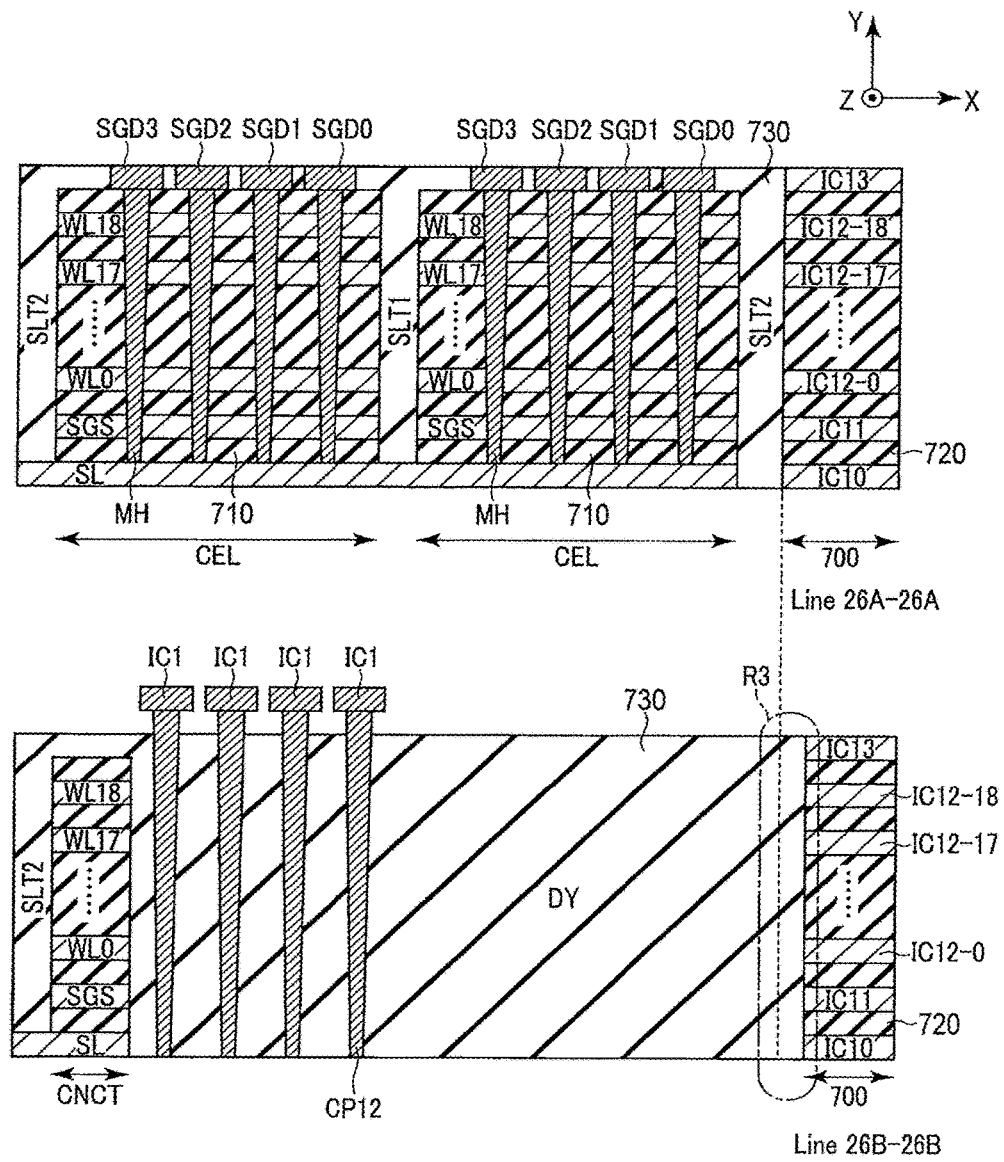
FIG. 26 shows sectional views taken along a line 26A-26A and a line 26B-26B in FIG. 25.

FIG. 26 shows sectional views of FIG. 25. The upper view is taken along a line 26A-26A, and the lower view is taken along a line 26B-26B. The upper and lower views of FIG. 26 indicate the same position in the X direction.

As shown in FIG. 26, in each cell portion CEL, the selection gate line SGS, the word lines WL0 to WL18, and the selection gate lines SGD are provided above the source line SL with an insulating layers 710 interposed therebetween. The stacked structure 700 also has the same stacked structure as the cell portion. That is, interconnect layers IC11, IC12-0 to IC12-18, and IC13 are formed above an interconnect layer IC10 with an insulating layers 720 interposed therebetween. The interconnect layer IC10 is formed at the same time as the source line SL at the same level (height) using, for example, the same material. The interconnect layer IC11 is formed at the same time as the selection gate line SGS at the same level (height) using, for example, the same material. The interconnect layers IC12-0 to 12-18 are formed at the same time as the word lines WL0 to WL18 at the same levels (heights) using, for example, the same material. The interconnect layer IC13 is formed at the same time as the selection gate lines SGD at the same level (height) using, for example, the same material. Note that the interconnect layer IC13 may be not formed. An insulating layer 730 is buried between the stacked structure 700 and the cell portion CEL (and a hook-up portion WLHU and a connecting portion CNCT).

The stacked structure 700 does not actually function as a certain semiconductor element. Hence, the interconnect layers IC11, IC12-0 to IC12-18, and IC13 included in the stacked structure 700 may be electrically isolated from the source line SL, the selection gate line SGS, the word lines WL0 to WL18, and the selection gate lines SGD and fixed to a predetermined potential (for example, 0 V), or may be set in an electrically floating state.

In this embodiment, as shown in the lower view of FIG. 26, the recess R3 is formed in a portion facing the trench DY, and the insulating layer 730 is buried in the recess. In other words, in the region facing the trench DY, the width of the stacked structure 700 along the X-axis direction is made smaller than in the remaining regions (for example, a region facing the cell portion CEL).

3.2 Effect According to this Embodiment

As described in the first embodiment, the interconnect layers functioning as the source line SL, the selection gate line SGS, the word lines WL, and the selection gate lines SGD are etched when forming the lanes C and the lanes R. At this time, inside the memory cell array 110, since the regions to be etched are located at equal intervals and have the same etching width, processing may be executed at a high accuracy. However, etching performed at the ends of the memory cell array 110 is performed not for the purpose of forming the lanes C and the lanes R but for the purpose of removing all interconnect layers in unnecessary regions other than the memory cell array 110. Hence, at the ends of the memory cell array 110, the periodicity of the etching pattern may be disturbed, and the processing accuracy may lower.

In this embodiment, the stacked structure 700 like the cell region is provided on the periphery of the memory cell array 110, thereby enabling etching based on the same pattern as the lanes C and the lanes R inside the memory cell array 110. This makes it possible to process the interconnect layers at a high accuracy even at the ends of the memory cell array 110.

In addition, an etching for forming the trenches DY may be performed after the etching for forming the lanes C and the lanes R. Hence, when the stacked structure 700 is provided, part of the stacked structure 700 is also etched when forming the trenches DY. As a result, as shown in FIG. 25, the recess R3 is formed in the region facing the trench DY on the inner surface of the loop-shaped stacked structure.

4. Modifications and the Like

As described above, the semiconductor memory device according to the above embodiment includes a row decoder provided on a semiconductor substrate, and a memory cell array provided above the row decoder and including a first block. The first block includes a first region (CEL in FIG. 10) spreading along a first plane formed by a first direction (Y direction in FIG. 10) that is an in-plane direction of the semiconductor substrate and a second direction (X direction in FIG. 10) that is the in-plane direction and is different from the first direction and having a first width along the second direction (X direction in FIG. 10), a second region (WLHU in FIG. 10) spreading along the first plane, having a second width larger than the first width along the second direction (X direction in FIG. 10), and being adjacent to the first region (CEL in FIG. 10) in the first direction (Y direction in FIG. 10); and a third region (CNCT in FIG. 10) spreading along the first plane, having a third width smaller than the first width along the second direction (X direction in FIG. 10), and located between the first region (CEL in FIG. 10) and the second region (WLHU in FIG. 10) to connect the first region and the second region. The first region, the second region, and the third region include a plurality of first word lines (WL in FIG. 15) stacked along a third direction (Z direction in FIG. 10) that is a vertical direction of the semiconductor substrate. The first region further includes a first selection gate line (SGD in FIG. 15) provided above a first word line of an uppermost layer. The memory cell array further includes a first insulating layer (730 in FIG. 26) buried in a first trench (DY in FIG. 10) between the first region (CEL in FIG. 10) and the second region (WLHU in FIG. 10) and being in contact with the third region (CNCT in FIG. 10) in the second direction (X direction in FIG. 10), a first contact plug (CP12 in FIG. 10 or 26) provided in the first insulating layer (730 in FIG. 26) and electrically connected to the row decoder, and a first interconnect layer (IC1 in FIG. 11 or 15) configured to connect the first selection gate line (SGD in FIG. 11 or 15) and the first contact plug (CP12 in FIG. 11 or 15).

In addition, the semiconductor memory device according to the above embodiment includes a row decoder (120) provided on a semiconductor substrate including a first surface, and a memory cell array provided above the row decoder and including a set of cell regions (60) arranged in a matrix, the memory cell array including an interconnect (WL) connected to the row decoder and overlapping the row decoder (120, RD) on a plane along the first surface. The row decoder (120) includes a first transistor (DR', 50 in FIGS. 23-24) provided outside an outer periphery of the set of the cell regions on the plane along the first surface.

In addition, the semiconductor memory device according to the above embodiment includes a memory cell array (110 in FIG. 25) including a source line (SL) provided above a first surface of a semiconductor substrate, and a word line (WL) provided above the source line, a wall (700 in FIG. 25) surrounding the memory cell array (110) in a plane along the first surface, including a plurality of conductive layers arranged in a direction crossing the first surface of the semiconductor substrate from a layer of the source line to a layer of the word line, and including a recess (R3 in FIG. 25) at an inner surface extending from an upper surface to a lower surface, and an insulating layer provided from a position of the upper surface of the wall to a position of the lower surface and being in contact with the inner surface of the wall in the recess.

Note that the embodiments are not limited to the above-described forms, and various modifications can be made. For example, in the above embodiments, a case in which the number of stacked word lines WL is 19 has been described as an example. However, the number is not limited to this, and is $2^n$ (n is a natural number) in general. Additionally, in the above embodiments, a case in which the memory holes MH are arranged in a staggered pattern, as shown in FIG. 10 or the like, has been described as an example. However, the silicon pillars MH may be arranged in a line in the Y-axis direction.

Figure 27:
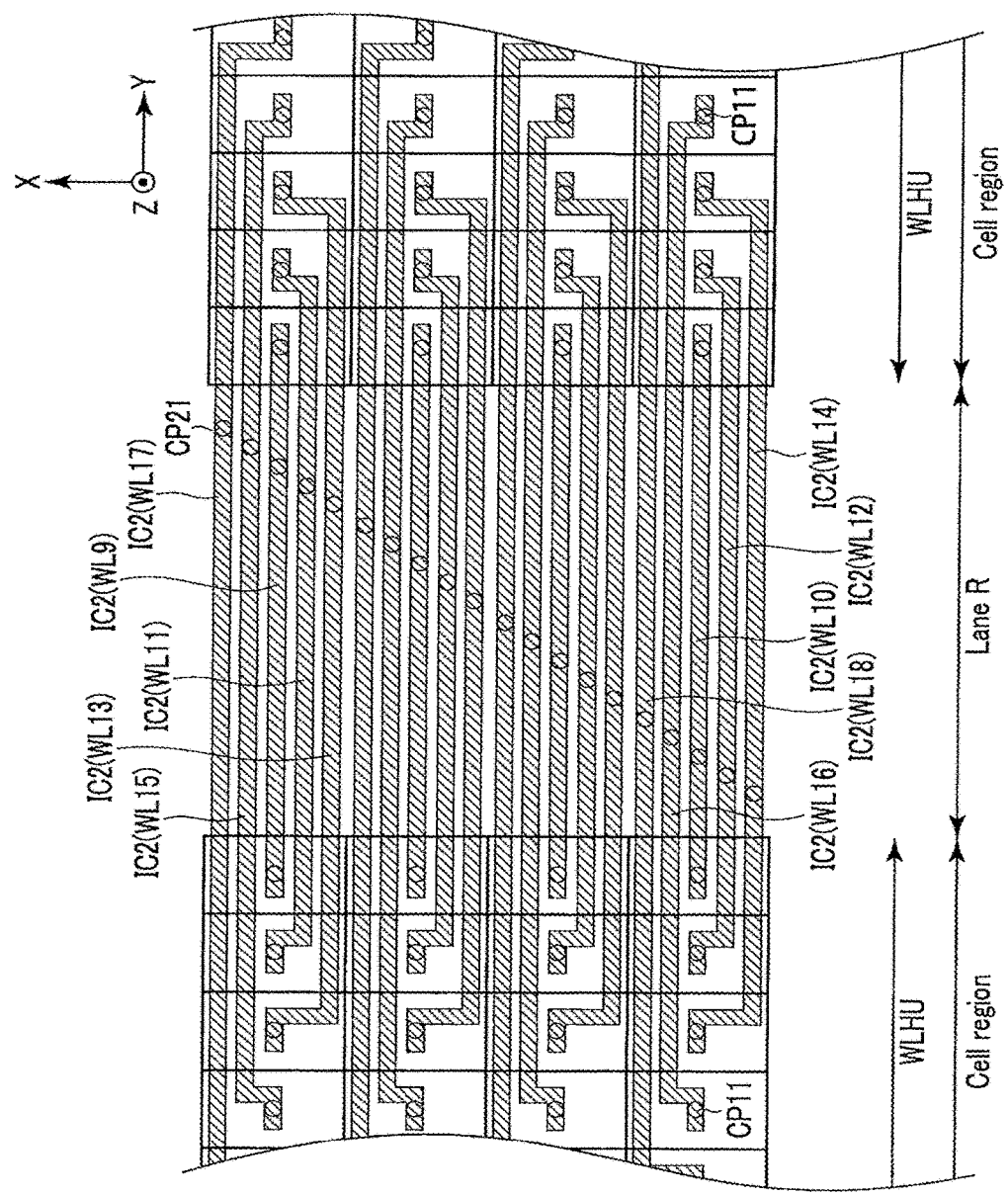
FIG. 27 is a planar layout diagram of a lane R according to the first modification of the first embodiment.
Figure 28:
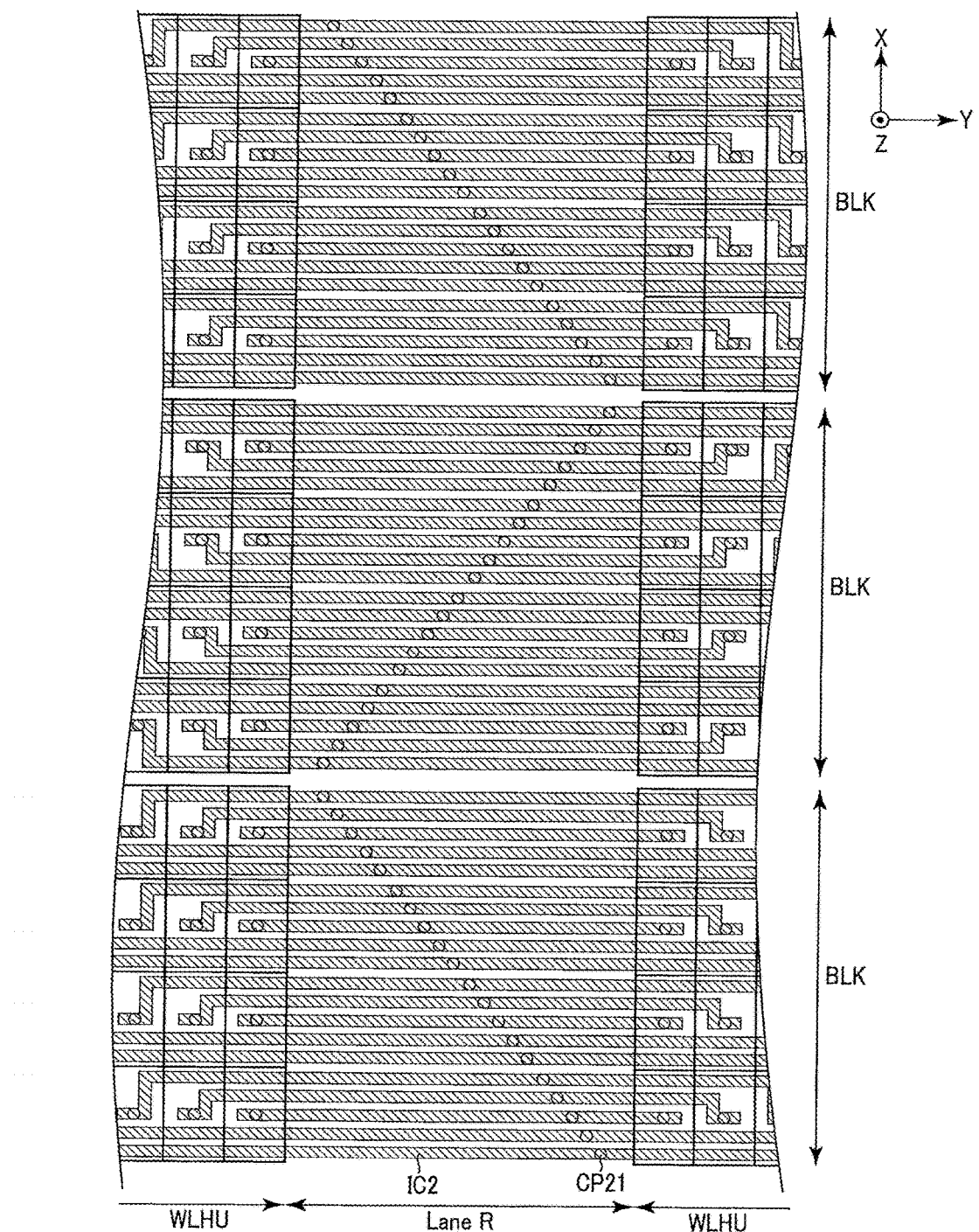
FIG. 28 is a planar layout diagram of a lane R according to the second modification of the first embodiment.

In FIGS. 12 and 13 described in the first embodiment, a case in which the contact plugs CP21 in the lane R are arranged on a straight line along the X-axis direction has been described as an example. However, as shown in FIG. 27, the contact plugs CP21 may be provided so as to be arranged on the X-Y plane in an oblique direction with respect to the X-axis direction and the Y-axis direction. In this case, as shown in FIG. 28, the directions in which the contact plugs CP21 corresponding to the plurality of blocks ELK adjacent to each other in the X direction are arranged may be opposite to each other. In other words, the contact plugs CP21 may be arranged such that the line that connects them may be bent at the boundaries of the blocks BLK.

In addition, the arrangement shown in FIG. 25 described in the third embodiment may be an arrangement shown in, for example, FIGS. 29, 30, and 31. That is, the stacked structure 700 faces the trenches DY at two surfaces facing in the X direction. At this time, the stacked structure 700 may face, at one surface, the trench DY between the hook-up portion WLHU of one block BLKa (the block located on the upper side in the Y-axis direction) and the cell portion CEL of the other block BLKb (the block located on the lower side in the Y-axis direction), and may face, at the other surface as well, the trench DY between the hook-up portion WLHU of the block BLKa and the cell portion CEL of the block BLKb.

Alternatively, as shown in FIG. 30, the stacked structure 700 may face, at one surface, the trench DY between the cell portion CEL of the block BLKa and the hook-up portion WLHU of the block BLKb, and may face, at the other surface as well, the trench DY between the cell portion CEL of the block BLKa and the hook-up portion WLHU of the block BLKb.

Otherwise, as shown in FIG. 31, the stacked structure 700 may face, at one surface, the trench DY between the cell portion CEL of the block BLKa and the hook-up portion WLHU of the block BLKb, and may face, at the other surface, the trench DY between the hook-up portion WLHU of the block BLKa and the cell portion CEL of the block BLKb.

In addition, the embodiments may be executed independently or may be executed in combination. That is, the second and third embodiments may be executed independently. When the third embodiment is executed in combination with the second embodiment, the stacked structure 700 may overlap the row decoder RD' at least partially. Alternatively, they may completely overlap. In this case, on the X-Y plane shown in FIG. 24, the row decoders RD' and the dummy regions DMY are covered with the stacked structure 700 and are invisible.

In addition, various arrangements can be applied to the memory cell array 110. An arrangement of the memory cell array 110 is described in, for example, U.S. patent application Ser. No. 12/407,403 filed on Mar. 19, 2009 and entitled "THREE DIMENSIONAL STACKED NONVOLATILE SEMICONDUCTOR MEMORY". Arrangements are also described in U.S. patent application Ser. No. 12/406,524 filed on Mar. 18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND METHOD FOR MANUFACTURING SAME". These patent applications are entirely incorporated herein by reference.

Furthermore, the terms "connect" and "couple" used in the embodiments include both a case in which direct connection is done and a case in which some constituent element intervenes. When the memory cell holds 2-bit data, the threshold voltage of the memory cell may have possible four levels. The four level includes "Er" level, "A" level, "B" level, and "C" level in ascending order of the threshold level, the voltage applied to the selected word line in the read operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V. The voltage applied to the selected word line in the read operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V. The voltage applied to the selected word line in the read operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V. A time (tR) of the read operation may be set within the range of, for example, 25 µs to 38 µs, 38 µs to 70 µs, or 70 µs to 80 µs.

A write operation includes a program operation and a verify operation. In the write operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V. The voltage first applied to the selected word line when write-accessing an odd-numbered word line and the voltage first applied to the selected word line when write-accessing an even-numbered word line may be different. If the program operation is ISPP (Incremental Step Pulse Program), the step-up voltage is, for example, 0.5 V. The voltage applied to an unselected word line may be set within the range of, for example, 6.0 V to 7.3 V. However, the voltage is not limited to this and may be set within the range of, for example, 7.3V to 8.4 or set to 6.0 V or less. The pass voltage to be applied may be changed depending on whether the unselected word line is an odd-numbered word line or an even-numbered word line. A time (tProg) of the write operation may be set within the range of, for example, 1,700 µs to 1,800 µs, 1,800 µs to 1,900 µs, or 1,900 µs to 2000 µs.

In erase operation, the voltage first applied to the well which is formed in the upper portion of the semiconductor substrate and above which the memory cell is arranged is set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V. A time (tErase) of the erase operation may be set within the range of, for example, 3,000 µs to 4,000 µs, 4,000 µs to 5,000 µs, or 4,000 µs to 9,000 µs.

The structure of the memory cell may include a charge accumulation layer arranged on a 4 to 10 nm thick tunnel insulating film. The charge accumulation layer may have a stacked structure of a 2 to 3 nm thick insulating film of SiN or SiOn and 3 to 8 nm thick polysilicon. A metal such as Ru may be doped into the polysilicon. An insulating film may be provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like is usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable. An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a row decoder provided on a semiconductor substrate; and
   a memory cell array provided above the row decoder and including a first block,
   wherein the first block includes:
   a first region spreading along a first plane formed by a first direction that is an in-plane direction of the semiconductor substrate and a second direction that is the in-plane direction and is different from the first direction and having a first width along the second direction;
   a second region spreading along the first plane, having a second width larger than the first width along the second direction, and being adjacent to the first region in the first direction; and
   a third region spreading along the first plane, having a third width smaller than the first width along the second direction, and located between the first region and the second region to connect the first region and the second region,
   wherein the first region, the second region, and the third region include a plurality of first word lines stacked along a third direction that is a vertical direction of the semiconductor substrate, and the first region further includes a first selection gate line provided above a first word line of an uppermost layer, and
   the memory cell array further includes:
   a first insulating layer buried in a first trench between the first region and the second region and being in contact with the third region in the second direction;
   a first contact plug provided in the first insulating layer and electrically connected to the row decoder; and
   a first interconnect configured to connect the first selection gate line and the first contact plug.

2. The semiconductor memory device according to claim 1, wherein the memory cell array further includes a second block,
   the second block includes:
   a fourth region spreading along the first plane and having a fourth width along the second direction;
   a fifth region spreading along the first plane, having a fifth width larger than the fourth width along the second direction, and being adjacent to the fourth region in the first direction; and
   a sixth region spreading along the first plane, having a sixth width smaller than the fourth width along the second direction, and located between the fourth region and the fifth region to connect the fourth region and the fifth region,
   the fourth region, the fifth region, and the sixth region include a plurality of second word lines stacked along the third direction, and the fourth region further includes a second selection gate line provided above a second word line of the uppermost layer,
   the memory cell array further includes:
   a second insulating layer buried in a second trench between the fourth region and the fifth region and being in contact with the sixth region in the second direction;
   a second contact plug provided in the second insulating layer and electrically connected to the row decoder; and
   a second interconnect configured to connect the second selection gate line and the second contact plug,
   the first region and the fourth region are adjacent to each other in the second direction with a third insulating layer interposed therebetween, the third insulating layer being buried in a third trench between the first region and the fourth region,
   the second region and the fifth region face each other in the first direction with the first region and the fourth region interposed therebetween,
   the first trench extends to a portion between the second region and the fourth region, and the second region and the fourth region are isolated by the first insulating layer, and
   the second trench extends to another portion between the first region and the fifth region, and the first region and the fifth region are isolated by the second insulating layer.

3. The semiconductor memory device according to claim 2, wherein the memory cell array further includes a third block,
   the third block includes:
   a seventh region spreading along the first plane and having a seventh width along the second direction;
   an eighth region spreading along the first plane, having an eighth width larger than the seventh width along the second direction, and being adjacent to the seventh region in the first direction; and
   a ninth region spreading along the first plane, having a ninth width smaller than the seventh width along the second direction, and located between the seventh region and the eighth region to connect the seventh region and the eighth region,
   the seventh region, the eighth region, and the ninth region include a plurality of third word lines stacked along the third direction, and the seventh region further includes a third selection gate line provided above a third word line of the uppermost layer,
   the memory cell array further includes:
   a fourth insulating layer buried in a fourth trench between the seventh region and the eighth region and being in contact with the ninth region in the second direction;
   a third contact plug provided in the fourth insulating layer and electrically connected to the row decoder; and
   a third interconnect configured to connect the third selection gate line and the third contact plug,
   the second region and the eighth region are adjacent to each other in the second direction across a fifth insulating layer buried in a fifth trench between the second region and the eighth region, and
   the first trench and the fourth trench are located on the same line along the second direction.

4. The semiconductor memory device according to claim 3, further comprising:
a plurality of stripe-shaped bit lines along the second direction, which are provided above the first region, the fourth region, and the seventh region in the third direction; and
a fourth contact plug provided in the fifth insulating layer buried in the fifth trench and connected to a bit line,
wherein the bit line is electrically connected to a sense amplifier via the fourth contact plug.

5. The semiconductor memory device according to claim 3, wherein, one of the first word lines which is in a lowermost layer is provided above a first source line,
one of the third word lines which is in the lowermost layer is provided above a third source line, and
the first source line and the third source line are commonly connected in a region immediately under the fifth trench.

6. The semiconductor memory device according to claim 4, further comprising a fourth interconnect provided in a region between the semiconductor substrate and the memory cell array,
wherein, one of the first word lines which is in a lowermost layer is provided above a first source line,
one of the third word lines which is in the lowermost layer is provided above a third source line,
the fifth trench is formed from upper surfaces of the first word line and the third word line of the uppermost layer to at least a depth reaching bottom surfaces of the first source line and the third source line, and
the fourth contact plug is formed from the bit line to another depth reaching the fourth interconnect.

7. The semiconductor memory device according to claim 2,
wherein the memory cell array further includes a third block,
the third block includes:
a seventh region spreading along the first plane and having a seventh width along the second direction;
an eighth region spreading along the first plane, having an eighth width larger than the seventh width along the second direction, and being adjacent to the seventh region in the first direction; and
a ninth region spreading along the first plane, having a ninth width smaller than the seventh width along the second direction, and located between the seventh region and the eighth region to connect the seventh region and the eighth region,
the seventh region, the eighth region, and the ninth region include a plurality of third word lines stacked along the third direction, and the seventh region further includes a third selection gate line provided above a third word line of as the uppermost layer,
the memory cell array further includes:
a fourth insulating layer buried in a fourth trench between the seventh region and the eighth region and being in contact with the ninth region in the second direction;
a third contact plug provided in the fourth insulating layer and electrically connected to the row decoder; and
a third interconnect configured to connect the third selection gate line and the third contact plug, and
the second region and the eighth region are adjacent to each other in the first direction across a fifth insulating layer buried in a fifth trench between the second region and the eighth region.

8. The semiconductor memory device according to claim 5, wherein the memory cell array further includes:
a fourth contact plug provided in the fifth insulating layer; and
a fifth interconnect connected to the fourth contact plug and having a longitudinal direction along the first direction,
the first block further includes a fifth contact plug provided on the first word line in the second region,
the third block further includes a sixth contact plug provided on the third word line in the eighth region,
the fifth interconnect is extracted to the second region and the eighth region and connected to the fifth contact plug and the sixth contact plug, and
the first word line and the third word line are electrically connected to the row decoder via the fifth interconnect and the fourth contact plug.

9. The semiconductor memory device according to claim 8, further comprising a sixth interconnect provided in a region between the semiconductor substrate and the memory cell array,
wherein, one of the first word lines which is in a lowermost layer is provided above a first source line,
one of the third word lines which is in the lowermost layer is provided above a third source line,
the fifth trench is formed from upper surfaces of the first word line and the third word line of the uppermost layer to at least a depth reaching bottom surfaces of the first source line and the third source line, and
the fourth contact plug is formed from the fifth interconnect to another depth reaching the sixth interconnect.

10. The semiconductor memory device according to claim 8, wherein the second region includes a plurality of step surfaces along the first direction, and has a shape that decreases a height as a distance to the fifth insulating layer from the plurality of step surfaces becomes small,
one of the first word lines is exposed to one of the plurality of step surfaces,
the eighth region includes the plurality of step surfaces along the first direction, and has the shape that decreases the height as the distance to the fifth insulating layer from the plurality of step surfaces becomes small, and
one of the third word lines is exposed to one of the plurality of step surfaces.

11. The semiconductor memory device according to claim 1, further comprising a second interconnect provided in a region between the semiconductor substrate and the memory cell array,
wherein, one of the first word lines which is in a lowermost layer is provided above a source line,
the first trench is formed from an upper surface of the first word line of the uppermost layer to at least a depth reaching a bottom surface of the source line, and
the first contact plug is formed from the first interconnect to a another depth reaching the second interconnect.

12. The semiconductor memory device according to claim 2, wherein, one of the first word lines which is in a lowermost layer is provided above a first source line,
one of the second word lines which is in the lowermost layer is provided above a second source line, and
the first source line and the second source line are commonly connected to a region immediately under the third trench.

* * * * *